(12) United States Patent
Chen et al.

(10) Patent No.: US 11,728,426 B2
(45) Date of Patent: Aug. 15, 2023

(54) FERROELECTRIC MFM INDUCTOR AND RELATED CIRCUITS

(71) Applicants: Taiwan Semiconductor Manufacturing Co., Ltd., Hsinchu (TW); National Taiwan University, Taipei (TW)

(72) Inventors: Miin-Jang Chen, Hsinchu (TW); Po-Hsien Cheng, Hsinchu (TW); Yu-tung Yin, Hsinchu (TW)

(73) Assignees: Taiwan Semiconductor Manufacturing Co., Ltd., Hsinchu (TW); National Taiwan University, Taipei (TW)

( * ) Notice: Subject to any disclaimer, the term of this patent is extended or adjusted under 35 U.S.C. 154(b) by 183 days.

(21) Appl. No.: 17/385,804

(22) Filed: Jul. 26, 2021

(65) Prior Publication Data

US 2021/0359135 A1 Nov. 18, 2021

Related U.S. Application Data

(62) Division of application No. 16/513,429, filed on Jul. 16, 2019, now Pat. No. 11,114,564.

(60) Provisional application No. 62/742,016, filed on Oct. 5, 2018, provisional application No. 62/720,744, filed on Aug. 21, 2018.

(51) Int. Cl.
| | |
|---|---|
| *H01L 29/78* | (2006.01) |
| *H03H 7/06* | (2006.01) |
| *H03H 7/01* | (2006.01) |
| *H01L 29/66* | (2006.01) |

(52) U.S. Cl.
CPC .. *H01L 29/78391* (2014.09); *H01L 29/66795* (2013.01); *H01L 29/785* (2013.01); *H03H 7/0115* (2013.01); *H03H 7/06* (2013.01)

(58) Field of Classification Search
CPC .............. H01L 29/78391; H01L 29/66795
See application file for complete search history.

(56) References Cited

U.S. PATENT DOCUMENTS

| | | | |
|---|---|---|---|
| 6,229,166 B1 | 5/2001 | Kim et al. | |
| 9,000,866 B2 * | 4/2015 | Subramanyam | H01P 1/15 333/24 C |
| 2007/0069264 A1 * | 3/2007 | Subramanyam | H01P 3/003 257/E29.345 |

(Continued)

OTHER PUBLICATIONS

Lin et al., "Induction of ferroelectricity in nanoscale $ZrO_2$ thin films on Pt electrode without post-annealing," *Journal of the European Ceramic Society* 37 (2017), Elsevier, Taipei, Taiwan, 2016, pp. 1135-1139, (5 pages).

(Continued)

*Primary Examiner* — Thao P Le
(74) *Attorney, Agent, or Firm* — Seed IP Law Group LLP

(57) ABSTRACT

Techniques in accordance with embodiments described herein are directed to a MFM structure that includes a resistance component, an inductance component and a capacitance component. The MFM device is equivalent to a series LC circuit with the resistance component coupled in parallel with the capacitance component. The MFM structure is used as a series LC resonant circuit, band-pass circuit, band-stop circuit, low-pass filter, high-pass filter, oscillators, or negative capacitors.

20 Claims, 19 Drawing Sheets

(56) References Cited

U.S. PATENT DOCUMENTS

| | | |
|---|---|---|
| 2014/0355328 A1 | 12/2014 | Mller et al. |
| 2015/0364338 A1* | 12/2015 | Ranjan et al. |
| 2016/0336312 A1* | 11/2016 | Yan .................. H01L 29/40111 |
| 2020/0066916 A1* | 2/2020 | Chen .................... H01L 29/775 |
| 2020/0105940 A1 | 4/2020 | Majhi et al. |
| 2020/0194435 A1 | 6/2020 | Lilak et al. |
| 2020/0411669 A1 | 12/2020 | Sharma et al. |
| 2021/0036122 A1* | 2/2021 | Wong ..................... B82Y 10/00 |
| 2021/0359135 A1* | 11/2021 | Chen ................... H03H 7/0115 |

OTHER PUBLICATIONS

Lu et al., "Induction of ferroelectricity in nanoscale $ZrO_2/HfO_2$ bilayer thin films on $Pt/Ti/SiO_2/Si$ substrates," *Acta Materialia* 115 (2016), Elsevier, Taipei, Taiwan, 2016, pp. 68-75. (8 pages).

\* cited by examiner

US 11,728,426 B2
FERROELECTRIC MFM INDUCTOR AND RELATED CIRCUITS

BACKGROUND

A ferroelectric material includes a spontaneous electric polarization that can be reversed by changing an electrical field applied to the ferroelectric material. Ferroelectric materials have been used in devices in gate structures of a transistor or in capacitors. Conventional ferroelectric materials include lead zirconium titanate $Pb(Zr_x, Ti_{1-x})O_3$ (PZT), hafnium dioxide ($HfO_2$), zirconium dioxide ($ZrO_2$), hafnium zirconium oxide ($Hf_xZr_{1-x}O_2$ or HZO), and ferroelectric polymers, such as polyvinylidene fluoride (PVDF).

BRIEF DESCRIPTION OF THE SEVERAL VIEWS OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
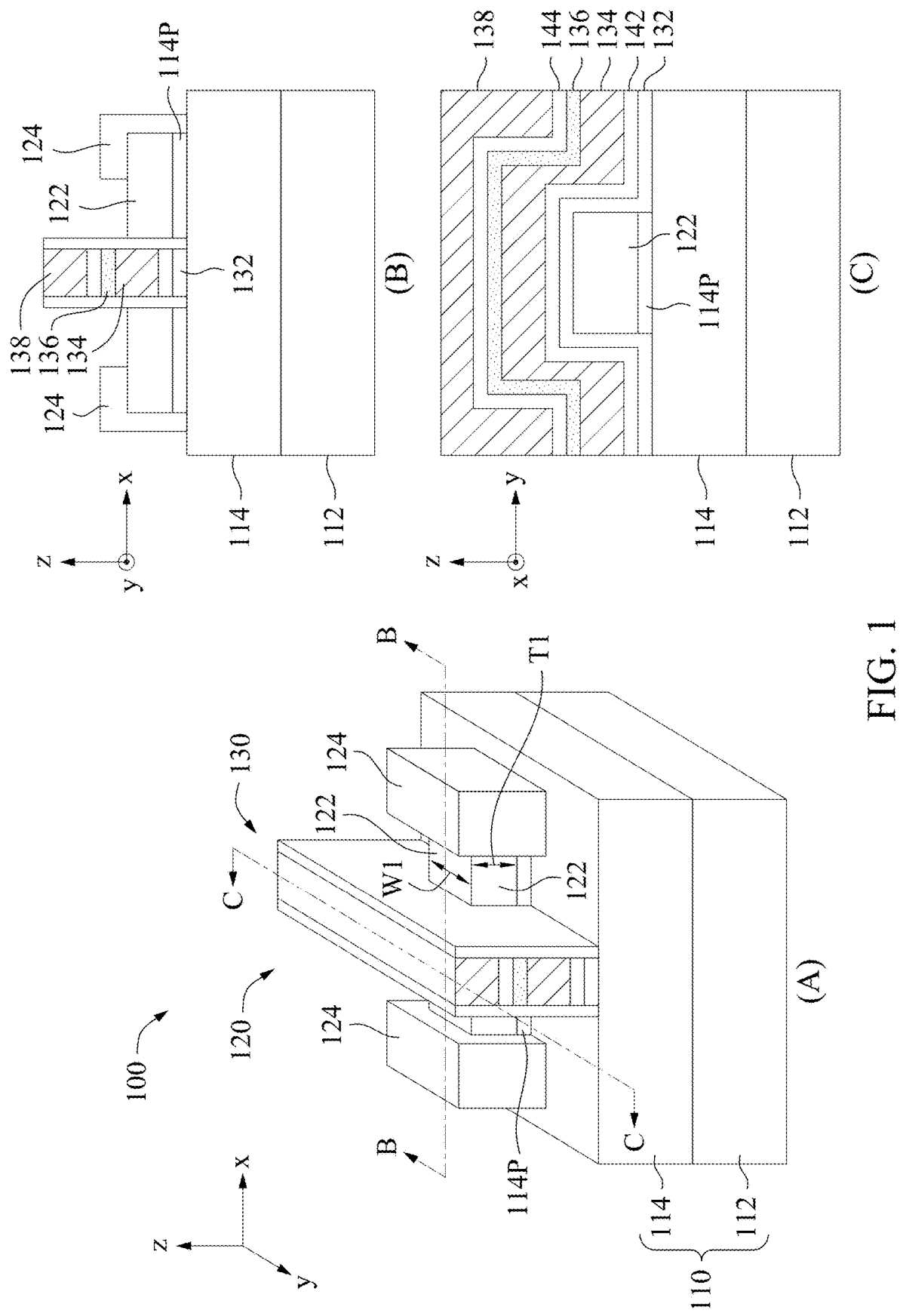
FIG. 1 is an example structure.

The disclosed technique is directed to an inductance device having a metal-ferroelectric-metal (MFM) structure. The insulator layer is ferroelectric dielectric material. The ferroelectric dielectric material may include a single domain polarization characteristic or multi-domain polarization characteristic. Thickness and deposition parameters of the ferroelectric layer may be controlled to ensure that the ferroelectric layer exhibits multi-domain characteristics.

The MFM structure includes a resistance component, an inductance component and a capacitance component. In an embodiment, the MFM device is equivalent to a series LC circuit with the resistance component coupled in parallel with the capacitance component. The MFM structure is used as series LC resonant circuit, band-pass circuit, band-stop circuit, low-pass filter, high-pass filter, oscillators, or negative capacitors.

In an embodiment, the MFM structure includes a ferroelectric layer of $ZrO_2$ positioned between two metal layers of platinum Pt. A thickness of the $ZrO_2$ layer, in a direction extending between the two Pt metal layers, is within a range between about 1 nm to about 50 nm. In an embodiment, a thickness of the $ZrO_2$, in a direction extending between the two Pt metal layers, is within a range between about 8 nm to about 50 nm. In an embodiment, the $ZrO_2$ layer has a thickness of about 12 nm. The thickness of the ferroelectric layer is related to a resistance and a capacitance value of the MFM structure and a ferroelectric property, e.g., the multi-domain characteristic, can be controlled for each ferroelectric material based on the circuitry applications of the MFM. One or more conductive coating layers, e.g., of titanium nitride TiN, may be included in the MFM structure, one or more of between the Pt metal layer and the $ZrO_2$ ferroelectric layer or outside the Pt layer. The TiN coating layers are used to, among others, enhance the adhesion of the Pt layer with the $ZrO_2$ ferroelectric layer or other layers surrounding the MFM structure.

In an embodiment, the $ZrO_2$ layer is deposited with a ferroelectric property, and there is no post-deposition annealing ("PDA") treatment of the deposited $ZrO_2$ layer. The elimination of a high temperature PDA treatment, e.g., in the range of about 400° C. to about 1000° C., enables the MFM structure and fabrication process to be well compatible with existing and future CMOS processes. For example, the back-end-of-line processes in the CMOS fabrication are vulnerable to the heating effects of the high temperature annealing processes.

In an embodiment, the MFM structure is part of a gate electrode of a transistor device. The transistor device has a silicon channel formed on a silicon-on-insulator substrate, and a gate structure at least partially over the silicon channel. The gate structure includes a high-k gate dielectric layer, e.g., of $HfO_2$, and a MFM structure over the high-k gate dielectric layer. The MFM structure includes a vertical stack of TiN, Pt, ferroelectric $ZrO_2$, TiN, and Pt. In combination with a nanoscale silicon strip configured as a junctionless transistor, the MFM gate stack enables a subthreshold swing ("SS") less than 60 mV/dec operated at a relatively large $V_{ds}$ of about 1V.

The thickness of the ferroelectric layer can be varied to modify the parameters of one or more of the resistance component, inductance component, or capacitance component of the MFM structure. For example, a thicker ferroelectric layer in the MFM structure brings about a larger resistance value of the resistance component and a lower capacitance value of the capacitance component. The thickness of the ferroelectric layer also affects the multi-domain characteristics of the MFM structure. In an example, an area size of the Pt metal layer affects the capacitance value of the MFM. The capacitance value of MFM structure increases with enlarged area size of the Pt metal layer. With the properly tuned capacitance, inductance and/or resistance value, the MFM structure are used for various suitable RLC circuit applications.

The disclosure herein provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity, and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The following description refers to an example field effect transistor as an example of a semiconductor structure incorporating a MFM structure to which the present description applies; however, the present description is not limited in applicability to transistors or the specific transistor structures. For example, the follow description applies to other types of semiconductor structures where negative capacitance property of a MFM structure is desired to offset an impact of a dielectric capacitor that is coupled in series with the MFM structure.

FIG. 1 illustrates an example structure 100. FIG. 1 includes three views (A), (B), (C) of the structure 100. View (A) is a three-dimensional perspective image. Views (B) and (C) are cross-sectional images from cutting planes B-B or C-C, respectively. Referring to FIG. 1, the structure 100 includes a substrate 110, e.g., a silicon on insulator substrate. The silicon-on-insulator substrate 110 includes a buried insulator layer 114 over a silicon base layer 112. An active silicon layer over the buried insulator 114 is patterned to form a semiconductor body/channel layer 122 of a ferroelectric FET ("feFET") device 120. The feFET device 120 also includes two source/drain structures 124 adjacent to the channel layer 122 from two different ends of the channel layer 122 and a gate structure 130. The gate structure 130 is positioned at least partially over the channel layer 122.

In an embodiment, the feFET device 120 is configured as a junctionless transistor. The channel layer 122 is heavily doped uniformly, e.g., with a doping concentration of about $5 \times 10^{17} \sim 5 \times 10^{19}$ ions/cm$^3$, and is sufficiently thin and narrow. In an embodiment, a width W1 of the channel layer 122 is in a range of about 30 nm to about 60 nm. In an embodiment, the width W1 of the channel layer 122 is 50 nm. A thickness T1 of the channel layer 122 is in a range of about 10 nm to about 25 nm. In an embodiment, the thickness T1 of the channel layer 122 is 20 nm. The width or thickness ranges are important in allowing for full depletion of charge carriers when the junctionless transistor device 120 is turned off. The doping concentration range is important in allowing for a decent amount of current flow when the junctionless transistor device 120 is turned on. The doping is performed uniformly within the silicon channel layer 122, which simplifies the fabrication and is desirable for a junctionless operation of the transistor device 120.

The gate structure 130 includes a stack of multiple metal and dielectric layers that form a metal-ferroelectric-metal-insulator-semiconductor ("MFMIS") structure together with the channel layer 122. Specifically, the stack of layers includes, from lower level to higher level, a dielectric layer 132, e.g., a high-k dielectric layer, a first metal layer 134, a ferroelectric layer 136, and a second metal layer 138. In an embodiment, the high-k dielectric layer 132 is HfO$_2$ or other suitable high-k dielectric material. The metal layers 134, 138 are platinum Pt or other suitable metal materials. As described herein, the metal layers 134, 138 and the ferroelectric layer 136 form a MFM structure which has a negative capacitance characteristic due to the inductance component thereof. The inductive and/or negative capacitance MFM structure is coupled in series with dielectric capacitance element formed by the metal layer 134, the high-k dielectric layer 132, and the semiconductor layer plus the conductive material of the source/drain structure 124. The inductive or negative capacitance characteristic of the MFM will enhance the performance characteristic of the feFET device 130.

In an example embodiment, one or more conductive coating layers 142, 144, e.g., of titanium nitride TiN or other conductive compound material, are positioned below a metal layer 134, 138 to improve the adhesion between an overlaying metal layer 134, 138 and an underlying dielectric or ferroelectric layer 132, 136, respectively. Due to the use of the conductive coating layers 142, 144, the metal layers 134, 138 can be formed with a Ω-shaped cross-sectional profile like those shown in view (C) of FIG. 1. The Ω-shaped MFM structures are adjacent to the channel layer 122 from at least three sides of the channel layers 122, which enhances the control of the charge carrier density within the channel layer 122 and ensures that the inductance/negative capacitance characteristic of the MFM be applied onto the gate control of the channel layer 122 from at least three sides.

In an embodiment, the patterning of the channel layer 122 and/or the source/drain structure 124 over the silicon-on-insulator substrate 110 also patterns an upper portion of the buried insulator layer 114 to form insulation bumps 114P. The insulation bumps 114P are positioned below one or more of the channel layer 122 or the source/drain structure 124. FIG. 1, (A) or (C), shows that the insulator bump 114P substantially overlaps with the corresponding channel layer 122 or the source/drain structure 124, which is not limiting. It is possible that the insulation bumps 114P extend inward with respect to the overlaying channel layer 122 or source/drain structure 124 such that an undercut is formed between the insulation bumps 114P and the overlaying channel layer 122 or source/drain structure 124. Note that such an undercut, if any, may be completely or partially filled by another layer(s), e.g., a dielectric layer, that is subsequently formed. That is, the insulation bumps 114P may cover a surface area either substantially similar to or smaller than a surface area covered by the overlaying channel layer 122.

In some embodiment, the insulation bumps 114P may also be a different/separate insulation layer/material from that of the buried insulation layer 114.

In an embodiment, the high-k dielectric layer 132 has a thickness ranging from about 1 nm to about 10 nm. The metal layers 134, 138 have thicknesses ranging between about 1 nm to about 100 nm. The TiN layers 142, 144 have a thickness ranging between about 1 nm to about 100 nm. The ferroelectric layer 136 has a thickness ranging between about 1 nm to about 20 nm. In an embodiment, the thickness of the ferroelectric layer 136 may be tuned or selected based on the device design and/or circuit application designs of the device 100. For example, an increased thickness of the ferroelectric layer 136 brings about a higher resistance value and a lower capacitance.

Figure 2:
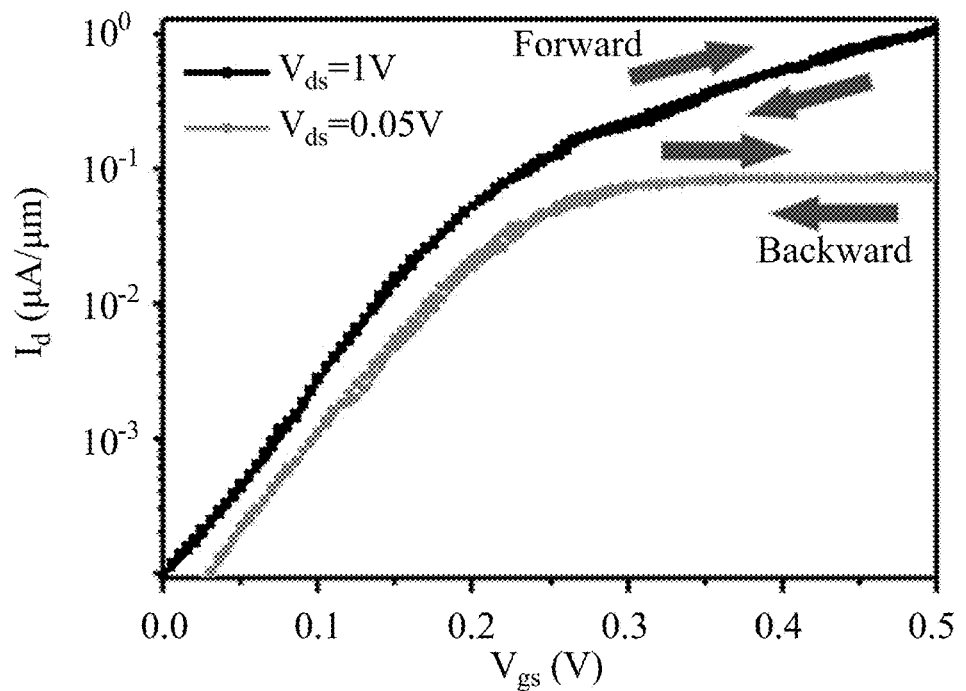
FIG. 2 shows forward and backward drain current-gate voltage curves of the example structure of FIG. 1.
Figure 3:
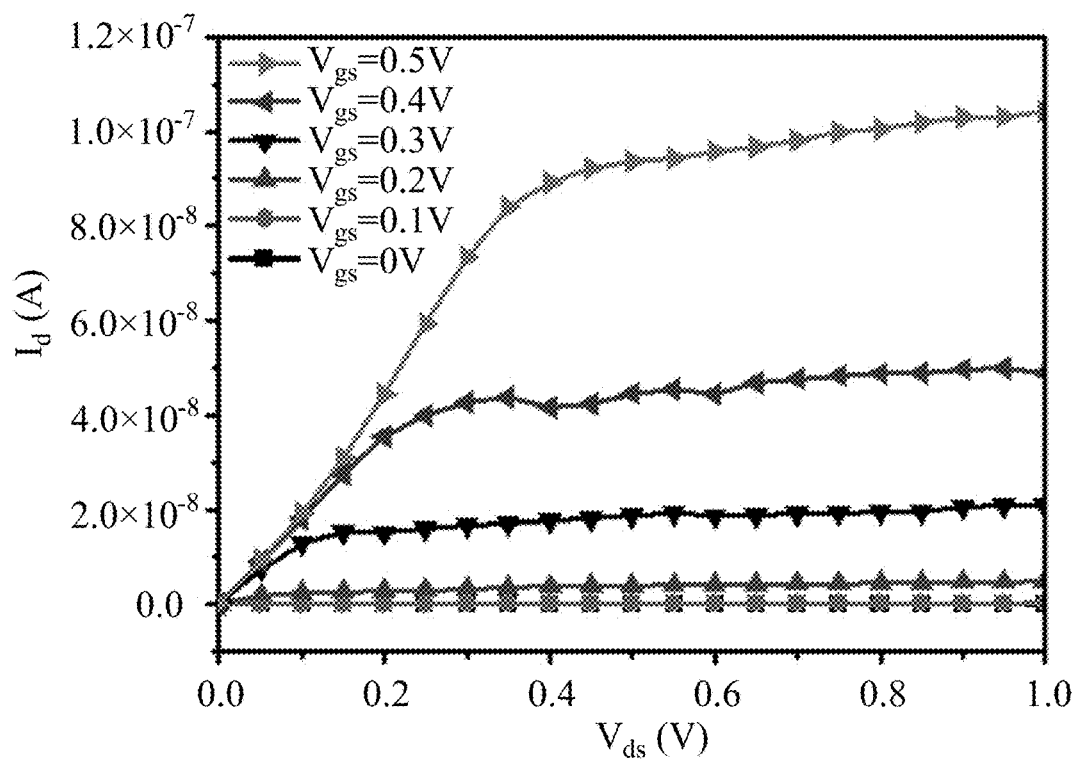
FIG. 3 shows drain current-drain voltage curves of the example structure of FIG. 1.

FIG. 2 shows the forward and backward drain current ("$I_d$")-gate voltage ("$V_{gs}$") curves of the feFET 120. FIG. 3 shows $I_d$-drain voltage ("Vas") curves of the feFET 100. The forward and backward $I_d$-$V_{gs}$ curves at $V_{ds}$=0.05V and 1V, respectively, indicate the almost hysteresis-free $I_d$-$V_{gs}$ characteristics. The almost hysteresis-free $I_d$-$V_{gs}$ characteristics can be deduced from the positive overall capacitance as required by the stability of negative capacitance.

Figure 4:
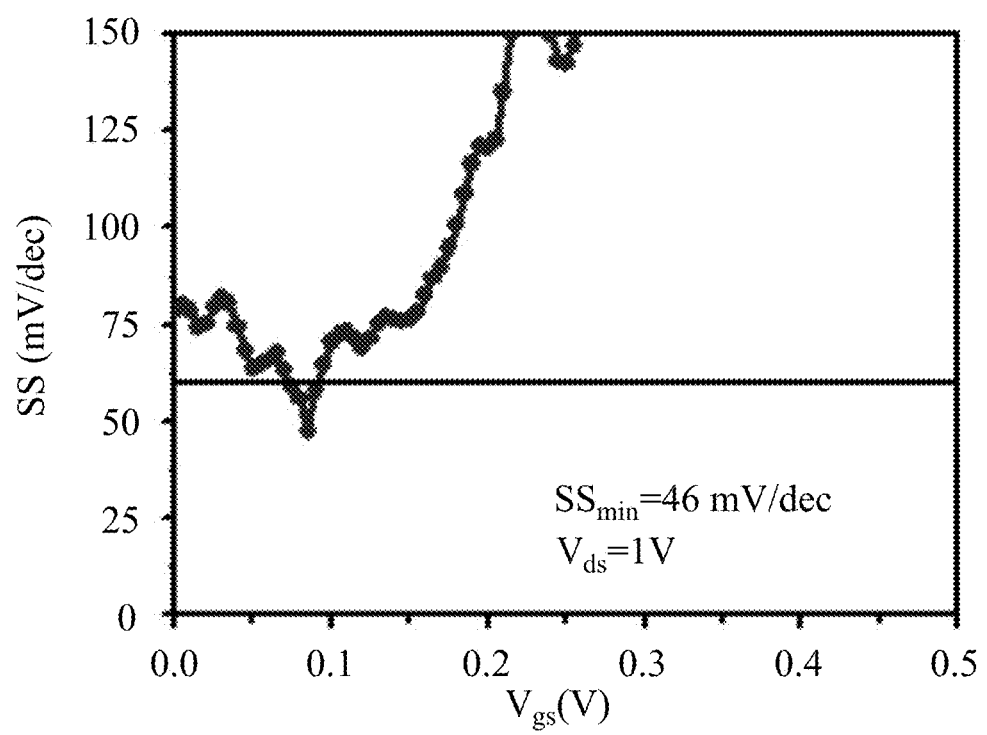
FIG. 4 shows a plot diagram of subthreshold swing of the example structure of FIG. 1.

FIG. 4 is a plot of subthreshold swing ("SS") of the feFET 120 at $V_{ds}$=1V versus $V_{gs}$, which illustrates SS<60 mV/dec and a minimum SS of 46 mV/dec. The sub-60 mV/dec SS in the feFET 120 operated at a relatively large $V_{ds}$ of 1V reveals the negative capacitance effect of the MFM structure 134, 136, 138 under the large-signal on-off transistor operations.

It should be appreciated that the example feFET 120 of junctionless transistor formed on the silicon-on-insulator substrate 110 is used as an illustrative example of a feFET device. The feFET device of the current disclosure may include other configurations, which are all included in the disclosure. For example the feFET device may be a transistor formed on a bulk semiconductor substrate. The feFET transistor may also be a gate-all-around ("GAA") transistor having nanowire channel strips. The feFET transistor may also be a thin-film-transistor ("TFT") formed on an interlayer dielectric layer.

Figure 5:
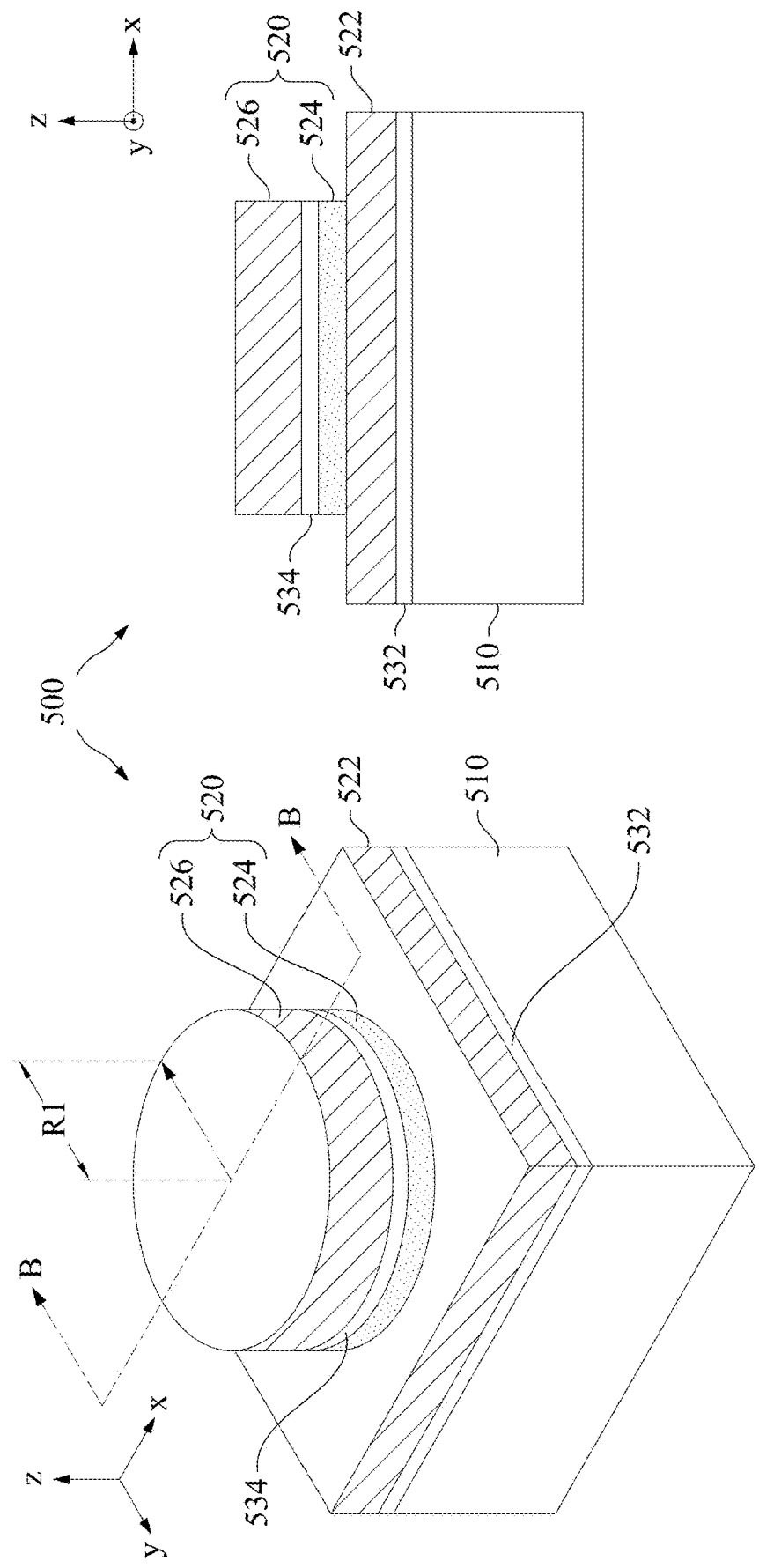
FIG. 5 illustrates another example structure.

FIG. 5 shows an example structure 500 including a stand-alone MFM structure 520. View (A) of FIG. 5 is a three-dimensional perspective view and view (B) is a cross-sectional view from cutting plane B-B. Referring to FIG. 5, the MFM structure 520 is formed over a base layer 510, e.g., a semiconductor substrate or a dielectric layer. The MFM structure 520 includes a first (lower) metal layer 522, a ferroelectric layer 524 and a second (upper) metal layer 526. In an embodiment, as shown in FIG. 5, the first metal layer 522 extends beyond the second metal layer 524 in at least one direction in the x-y plane to facilitate a vertical interconnection to the first metal layer, although the disclosure is not limited by this specific example.

In an embodiment, one or more conductive coating layers 532, 534 is positioned directly below a metal layer 522, 526 to enhance the adhesion of the metal layer 522, 526 to the underlying layers 510, 524.

In an embodiment, ferroelectric layer 524 is nanoscale $ZrO_2$. The nanoscale $ZrO_2$ has as-deposited ferroelectric properties such that no post-deposition annealing is needed. The elimination of the high temperature annealing treatment process enables that the MFM structure 520 be formed through the front-end-of-line (FEOL) process, e.g., over a semiconductor substrate, or through a back-end-of-line (BEOL) process. The compatibility of the MFM structure 500 with a BEOL process enables a vertical integration of the MFM structure 500 with other circuitry elements, e.g., transistors, capacitors, and resistors, that are formed through FEOL processes. As such, the devices density of an IC can be enhanced.

In an example embodiment, the metal layers 522 and 516 are platinum Pt with a thickness of about 70 nm. The ferroelectric layer 524 is nanoscale $ZrO_2$ with a thickness of about 12 nm. As an example, the second metal layer 526 and the ferroelectric $ZrO_2$ layer are formed to have a circular shape with a radius R1 of about 100 μm.

Figure 6:
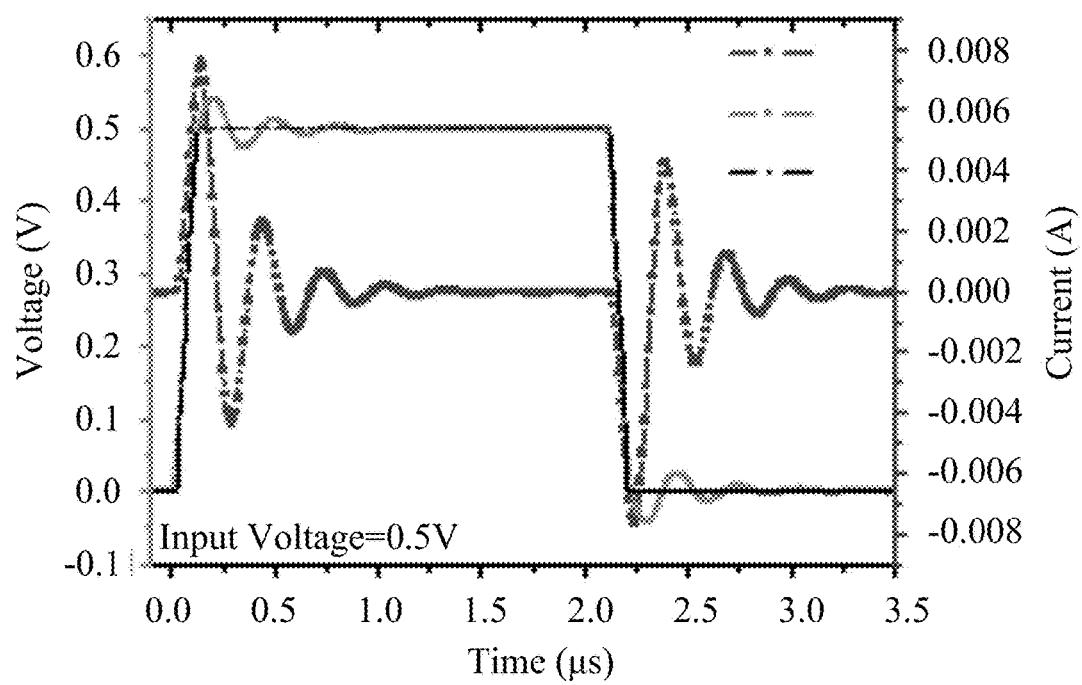
FIGS. 6 and 7 show transient responses of the example structure of FIG. 5, under the excitation of various voltage pulses.
Figure 7:
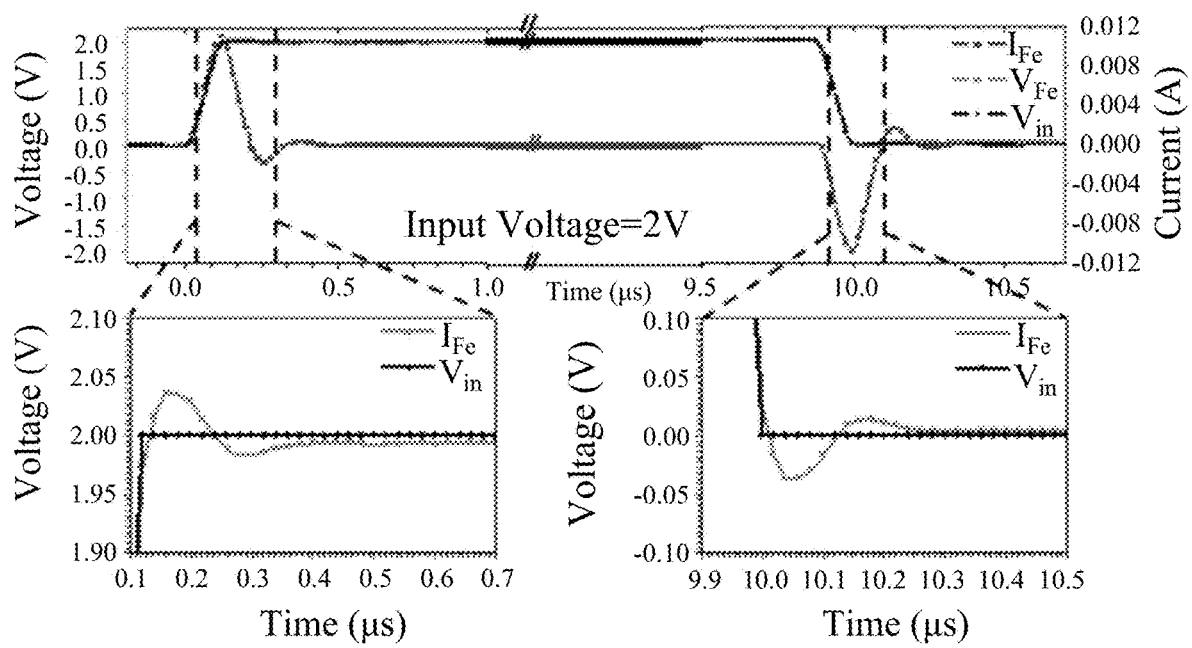

FIGS. 6 and 7 show the transient responses of the MFM 500 of FIG. 5, i.e., the time-domain voltage and current waveforms ("$V_{FE}$" and "$I_{FE}$") across nanoscale ferroelectric $ZrO_2$ layer 524 under the excitation of a voltage pulse $V_{in}$=0.5V (FIG. 6) or 2V (FIG. 7), respectively. In principle, a metal-insulator-metal (MIM) structure with paraelectric insulator typically exhibits RC charging and discharging features. However, the non-RC responses, i.e., the significant damped oscillations of $V_{FE}$ and $I_{FE}$ are clearly observed in FIGS. 6 and 7. The overshoot/undershoot of $V_{FE}$ and the damped oscillation of $I_{FE}$ agree well with the characteristics of the underdamped RLC response. As compared with FIG. 6 ($V_{in}$=0.5V), the suppressed damped oscillations of $V_{FE}$ and $I_{FE}$ in FIG. 7 ($V_{in}$=2V) are ascribed to a decrease of the resistance across nanoscale ferroelectric $ZrO_2$ layer 524 due to the increase of leakage at a larger $V_{in}$. Therefore, FIGS. 6 and 7 indicate the existence of an inductive component in the MFM structure 500.

Figure 8:
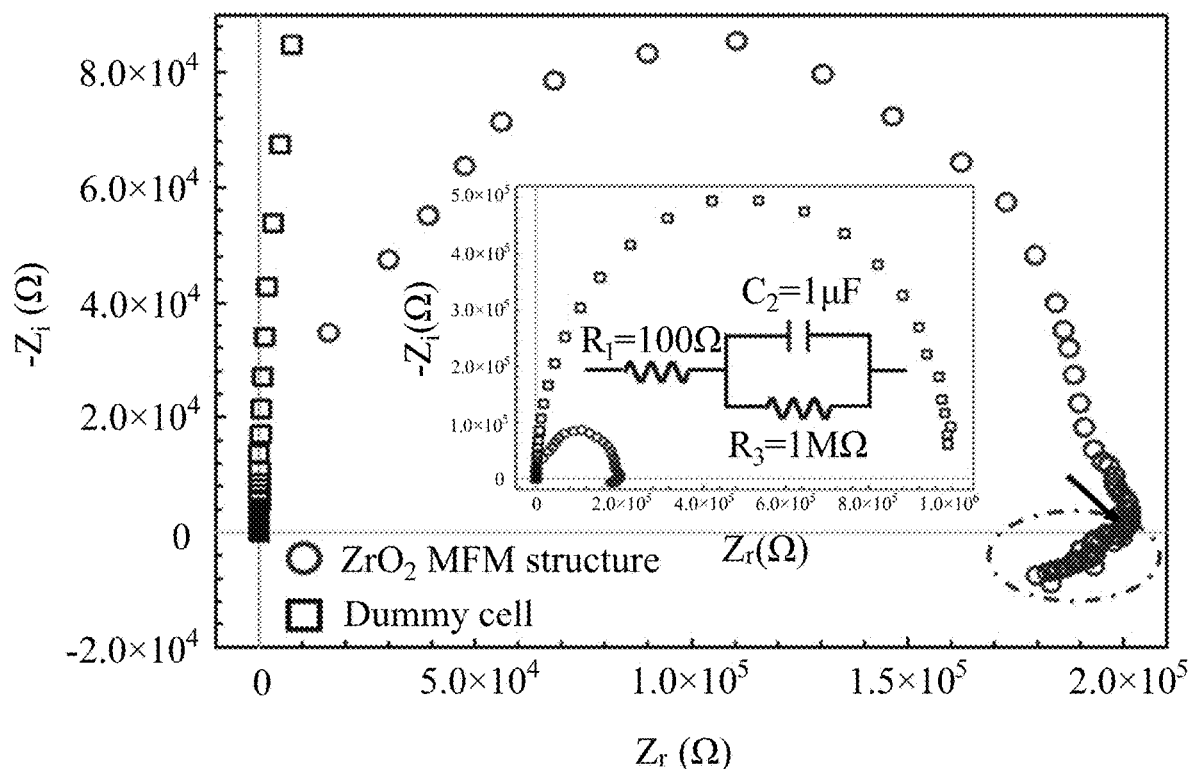
FIG. 8 shows a Nyquist plot of a complex impedance of the example structure of FIG. 5.

In order to confirm the presence of inductance in the MFM structure 500 having the nanoscale ferroelectric $ZrO_2$ layer 524, the impedance analyzer was used to probe the $ZrO_2$ MFM structure. FIG. 8 shows a Nyquist plot of the complex impedance (Zr+Zi) of the MFM structure 500, which was measured by an impedance analyzer in the frequency range from 1 m Hz to 10 m Hz at a 1V DC voltage and a 10 mV AC perturbation. The Zr and Zi in are the real and imaginary parts of the complex impedance. An inductive loop, characterized by positive imaginary impedance, appears in the lower part of the Nyquist plot. FIG. 8 includes an insert Nyquist plot of an RC dummy cell comprising a series of a resistor (100Ω) and an RC element (1 μF capacitance and 1M Ω resistance in parallel). The Nyquist plot of the RC dummy cell shows a semi-circle of negative imaginary impedance in the complex impedance. Comparison between the Nyquist plots of the MFM structure 500 and the RC dummy cell indicates that the MFM structure 500 includes an inductance component that causes the positive imaginary impedance, which does not exist with the RC dummy cell.

The physical origin of the ferroelectric inductance can be derived from the effective ferroelectric-induced emf, under which the charge redistribution caused by the ferroelectric polarization switching leads to a decrease of the voltage drop across the ferroelectric layer. The polarity of this effective ferroelectric-induced emf is opposite to the applied voltage, which is similar in behavior to Lenz's law indicating that the induced emf voltage acts against the applied voltage. Therefore, the effective ferroelectric-induced emf gives rise to the inductive responses of the ferroelectric layer.

Accordingly, the MFM structure 500 includes a resistance component "R", a capacitance component "C" and an inductance component "L". The R, C, L components effectively form a series LC circuitry with the R in parallel with the C, as exemplarily shown in FIG. 9, where L, R, C and Vs represent the inductor, resistor, capacitor, and voltage source, respectively. The i(t) and v(t) are the total current and the voltage across the capacitor C. The inductance component L is responsible for the decrease of the voltage drop across the ferroelectric capacitor due to the ferroelectric switching current.

Figure 9:
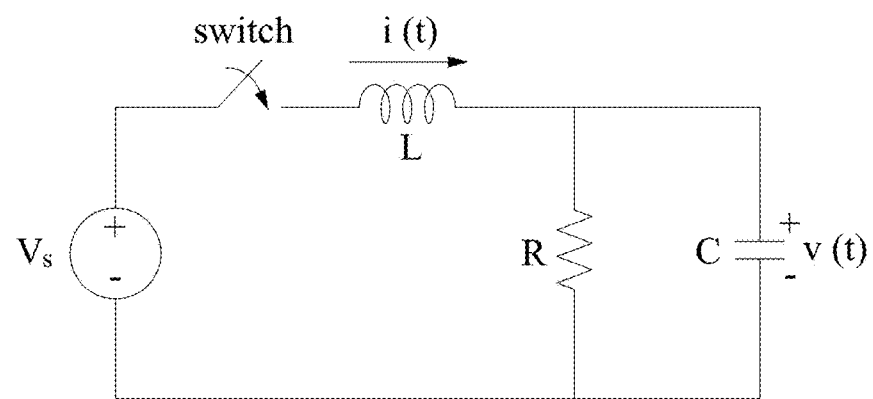
FIG. 9 shows an equivalent RLC circuit of the MFM structure of FIG. 5.

The step response of the MFM structure 500 as shown in FIGS. 6 and 7 can be approximated by this equivalent RLC circuit of FIG. 9 as follows (1) The initial condition:
Assume the switch in FIG. 9 is open at t=0. Hence $$i(t=0^-)=0 \text{ and } v(t=0^-)=0 \quad (1)$$

At t=0$^+$, the switch is closed. Because the capacitor voltage and inductor current have to keep continuous, the below is obtained:

$$i(t=0^+)=0 \text{ and } v(t=0^+)=0 \quad (2)$$

In order to obtain di(t=0$^+$)/dt, the Kirchhoff's voltage law is applied to the left mesh of the RLC in FIG. 9:

$$V_S = L\frac{di(t=0^+)}{dt} + v(t=0^+) = L\frac{di(t=0^+)}{dt} \quad (3)$$

As a result:

$$\frac{di(t=0^+)}{dt} = \frac{V_S}{L} \quad (4)$$

(2) The final steady state:
When the final steady state is reached, the inductance component L is replaced by a short circuit and the capacitance component C is replaced by an open circuit. The result gives:

$$i(t=\infty) = \frac{V_S}{R} \text{ and } v(t=\infty) = V_S \quad (5)$$

Figure 10:
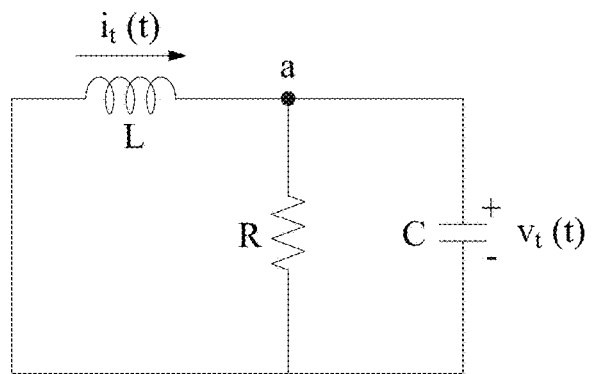
FIG. 10 illustrates an example operation of the MFM structure of FIG. 5.

(3) The transient current $i_t(t)$ at t>0
As the voltage source V in FIG. 9 is turned off, we have the circuit as shown in FIG. 10. Applying Kirchhoff's current law at the node a of FIG. 10 circuit gives $$i_t(t) = \frac{v_t(t)}{R} + C\frac{dv_t(t)}{dt} \quad (6)$$

Applying Kirchhoff's voltage law to the left mesh in FIG. 10 gives:

$$L\frac{di_t(t)}{dt} + v_t(t) = 0 \quad (7)$$

Therefore, the below differential equation are obtained describing the transient current $i_t(t)$ from equations (6) and (7):

$$\frac{d^2i_t(t)}{dt^2} + \frac{1}{RC}\frac{di_t(t)}{dt} + \frac{i_t(t)}{LC} = 0 \quad (8)$$

For the underdamped solution (L<4R$^2$C), the transient current $i_t(t)$ is given by $$i_t(t) = e^{-\alpha t}A\sin(\omega_d t + \phi) \quad (9)$$

where:

$$\omega_d = \sqrt{\omega_0^2 - \alpha^2} \quad \alpha = \frac{1}{2RC} \quad \omega_0 = \frac{1}{\sqrt{LC}}$$

Thus the underdamped response is a damped oscillation at a frequency $\omega_d$ with a decay rate determined by $\alpha$.

(4) The complete current response i(t) at t>0:
The complete current response i(t) is the sum of the final steady state of equation (5) and the transient current of equation (9):

$$i(t) = i(t=\infty) + i_t(t) = \frac{V_S}{R} + e^{-\alpha t}A\sin(\omega_d t + \phi) \quad (10)$$

where A and $\phi$ are constants and are determined by the initial conditions of equations (2) and (4). Equation (10) was then used to fit the transient current waveforms $I_{FE}$ (as shown in FIGS. 6 and 7) to evaluate the inductance L.

Figure 11:
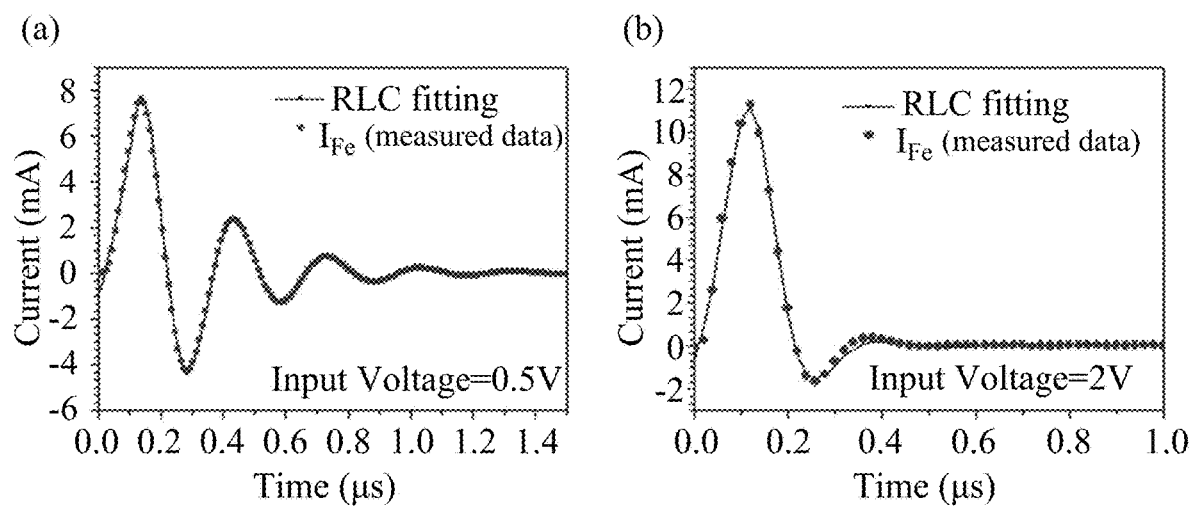
FIG. 11 shows the transient current responses of the example MFM structure of FIG. 5 under the excitation of various voltage pulses.

Hence the magnitude of the inductance can be estimated by curve fitting to the $I_{FE}$ waveforms based on this equivalent circuit. FIG. 11 shows curve fitting to the transient current responses of the MFM structure 500 under the excitation of a voltage pulse $V_{in}$ of 0.5V and 2V, in images (a) or (b) respectively.

As shown in FIG. 11, equation (10) fits well with the measured data points. The curve fitting gives an estimate of the inductance value of the inductance component, which is of the order of magnitude of ~10 µH if the capacitance is assumed to be a normal value of ~100 pF. Because the radius R1 (FIG. 2) of the MFM structure 500 is 100 µm, the inductance density of the ferroelectric ZrO$_2$ layer 524 is on the order of 10 mH/cm$^2$, which is much larger than that of the convention inductors based on the spiral electric coils (<10 µH/cm$^2$). As such, the nanoscale ferroelectric ZrO$_2$ layer 524 in the MFM structure 500 offers a much larger inductance density, which has wide circuit application and advantages.

The MFM structure 500 also exhibits small-signal capacitance, e.g., detected at a 1V DC bias voltage and a 30 mV AC perturbation. As appreciated, for a layer of ferroelectric single domain, the small-signal modulation hardly causes the ferroelectric polarization switching because the amplitude of small signals is much lower than the coercive voltage for polarization switching. The ferroelectric polarization switching of the MFM structure 500 under the small-signal operation is enabled by the ferroelectric multi-domains of the as-deposited $ZrO_2$ layer 524. The $ZrO_2$ layer 524 includes 180° out-of-phase ferroelectric multi-domains, which are favorable for the reduction of stray fields in ferroelectric layers. The polarizations in the ferroelectric multi-domains are organized with alternate orientations in opposing directions. The polarization in each domain of the multi-domains is elongated or compressed by an applied small-signal voltage, resulting in the switching of the net polarization in the ferroelectric layer.

Ferroelectric inductance and negative capacitance originating from the polarization switching are manifested via both small-signal or large-signal operations in the as-deposited nanoscale ferroelectric $ZrO_2$ layer 524 of the MFM structure 500. On the one hand, the nanoscale ferroelectric $ZrO_2$ layer 524 yields a positive imaginary impedance, demonstrating the ferroelectric inductance and negative capacitance under the small-signal modulation. The ferroelectric multi-domains are responsible for the small-signal operation of the ferroelectric inductance and negative capacitance. On the other hand, the RLC responses of the nanoscale ferroelectric $ZrO_2$ layer 524 and the sub-60 mV/dec SS of the feFET device 120 are attributed to the large-signal operation of the ferroelectric inductance and negative capacitance of the nanoscale ferroelectric $ZrO_2$ layer 524, 136. Analysis based on Maxwell's equations shows that the charge redistribution caused by the polarization switching contributes to the effective ferroelectric-induced emf, which reduces the voltage drop across the ferroelectric layer similar to the behavior described by Lenz's law. Therefore, the effective ferroelectric-induced emf is responsible for the inductive responses and negative capacitance of the nanoscale ferroelectric $ZrO_2$ layer 524, 136.

Figure 12:
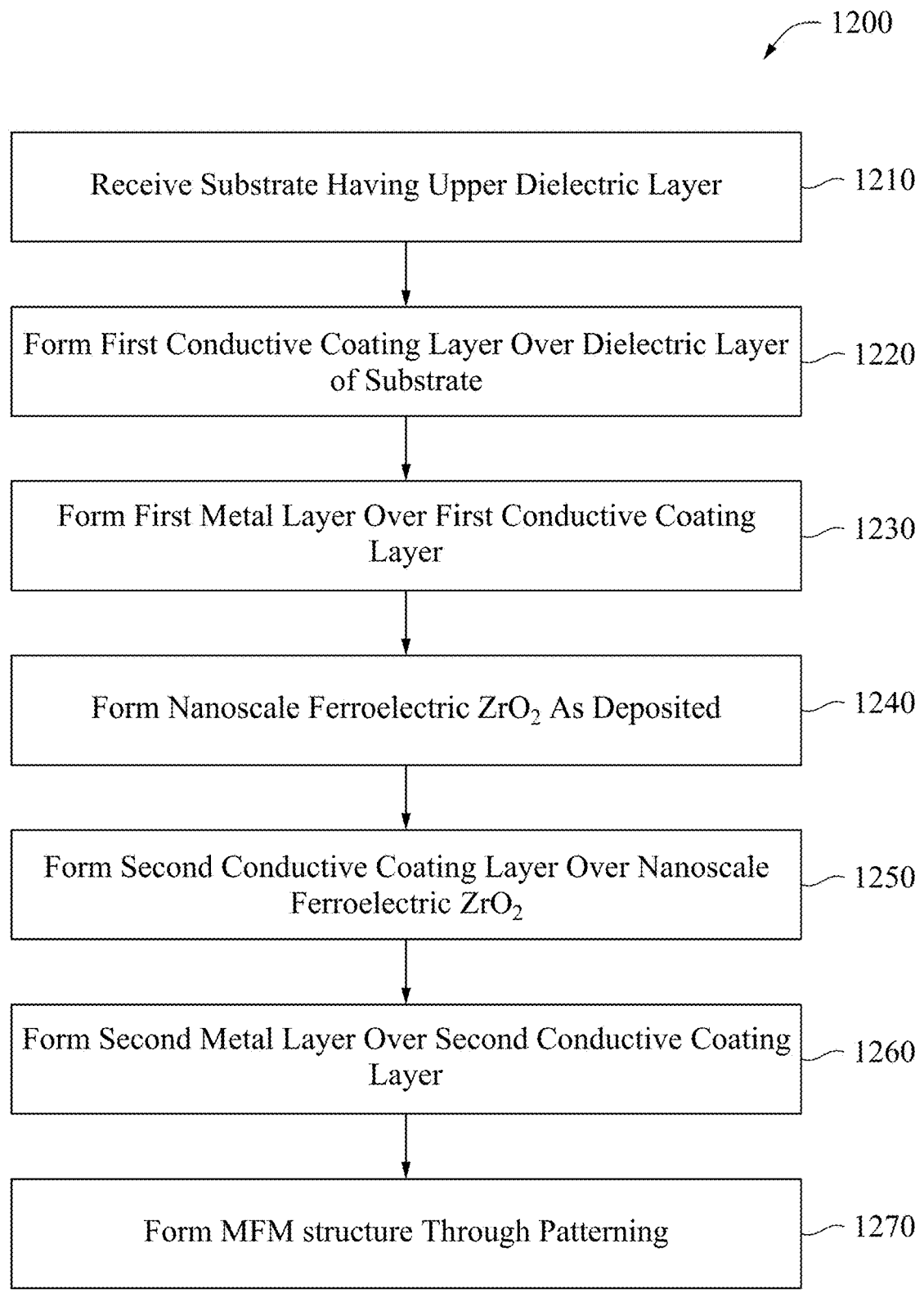
FIG. 12 is an example process.

FIG. 12 shows an example process 1200 of making the example MFM 500. FIGS. 13A-13G show a wafer 1300 in various stages of the process 1200. Referring to FIG. 12, with reference also to FIG. 13A, in example operation 1210, a substrate 1310 is received. The substrate 1310 may be a silicon substrate or another element semiconductor substrate, e.g., germanium substrate, or a compound semiconductor substrate, e.g., silicon germanium, gallium arsenide, or gallium nitride. The substrate 1310 may also be a silicon-on-insulator substrate or another substrate with a dielectric layer on an upper surface. For example, the substrate 1310 may be a wafer in a BEOL process, which includes an inter-layer dielectric layer on the top surface of the substrate 1310. In the description herein, it is assumed, for descriptive purposes, that the substrate 1310 includes a dielectric layer 1312 on an upper surface. The dielectric layer 1312 is silicon oxide or a low-k dielectric material.

Figure 13A:
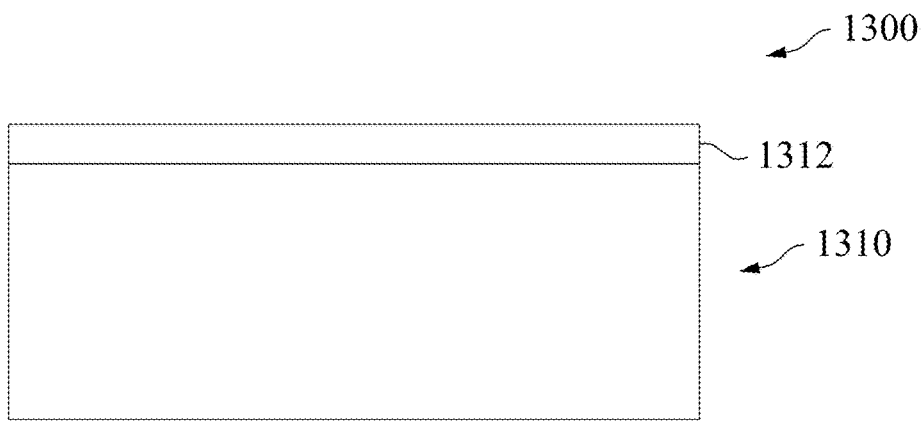
FIGS. 13A-13G are various stages of a wafer under the example process of FIG. 12.
Figure 13B:
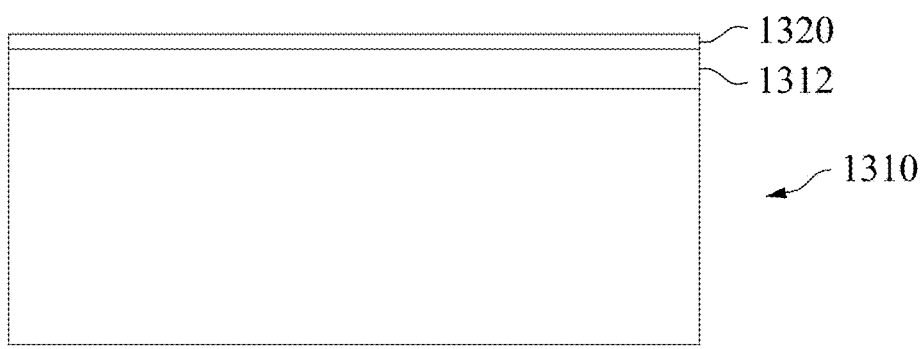

In example operation 1220, with reference also to FIG. 13B, optionally, a first conductive coating layer 1320 of TiN is formed over dielectric layer 1312. The first TiN layer 1312 is formed through atomic layer deposition ("ALD") with precursors tetrakis(dimethylamino)titanium (TDMATi, Ti[N(CH$_3$)$_2$]$_4$) and N$_2$/H$_2$ plasma and at a deposition temperature of between about 200° C. to about 350° C., or other suitable deposition processes. The first TiN layer is formed with a thickness ranging between about 1 nm to about 100 nm.

Figure 13C:
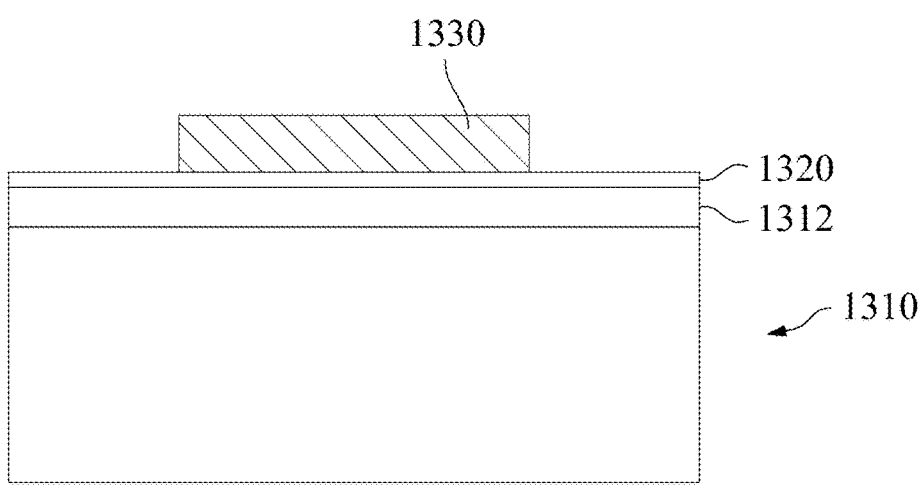

In example operation 1230, with reference also to FIG. 13C, a first metal layer 1330 of Pt is formed over the first conductive coating layer 1320. The first metal layer 1330 is formed through a physical vapor deposition process, e.g., a sputtering process, or other suitable deposition processes. The first coating layer 1320 of TiN enhances the adhesion between the Pt layer 1330 and the underlying substrate 1310, specifically the dielectric layer 1312. The first metal layer 1330 may be globally deposited and later patterned to define the shape of a first metal layer of a MFM structure, e.g., the MFM structure 500. Alternatively or additionally, the first metal layer 1330 is formed with a desired shape through a lift-off process. Other approaches to form and shape the first metal layer 1330 are also possible and included in the disclosure.

Figure 13D:
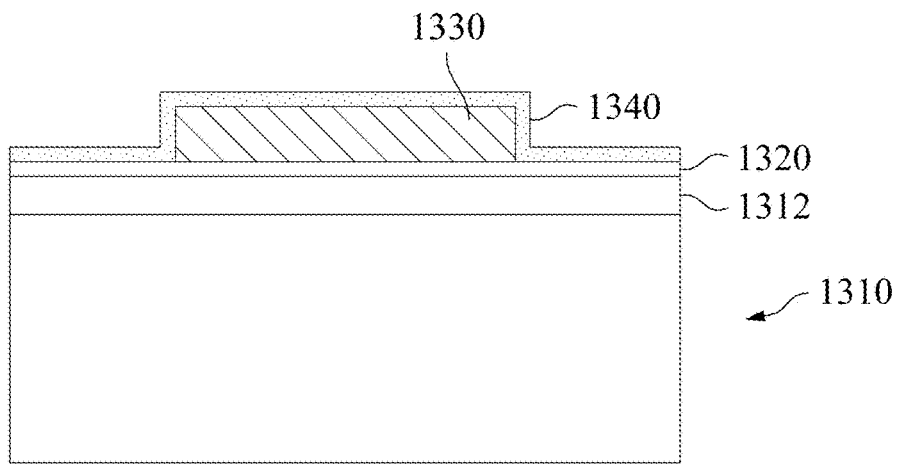

In example operation 1240, with reference also to FIG. 13D, a nanoscale ferroelectric $ZrO_2$ layer 1340 is formed over the first Pt layer 1330. The TiN layer 1312 is formed through atomic layer deposition ("ALD") with precursors tetrakis(dimethylamino)zirconium (TDMAZr, Zr[N(CH$_3$)$_2$]$_4$) and O$_2$ plasma and at a deposition temperature of between about 200° C. to about 350° C., or other suitable deposition processes. A thickness of the $ZrO_2$ layer 1340 may be controlled or tuned based on the device design or circuit design of the MFM structure. For example, a thicker $ZrO_2$ layer 1340 brings about a higher resistance value and a larger damping effect for the equivalent RLC circuitry of the MFM. In an embodiment, the $ZrO_2$ layer 1340 is formed with a thickness of about 12 nm.

Figure 13E:
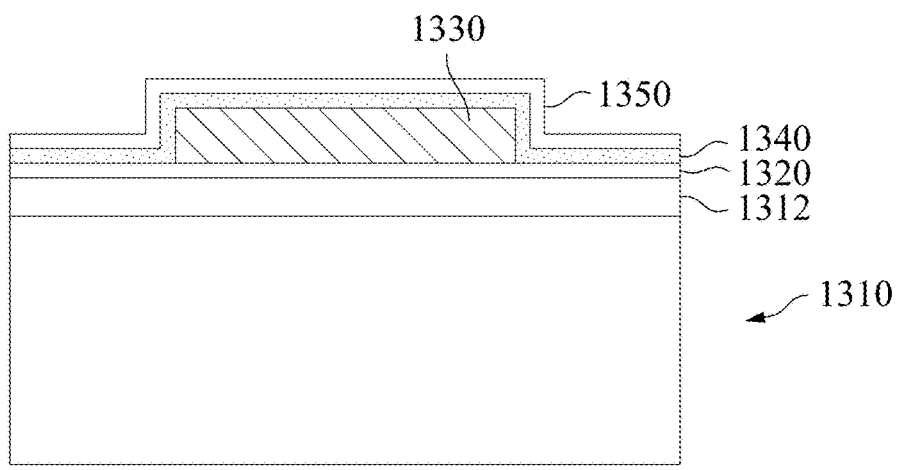

In example operation 1250, with reference also to FIG. 13E, optionally, a second conductive coating layer 1350 of TiN is formed over the ferroelectric $ZrO_2$ layer 1340. The second TiN layer 1350 is formed through atomic layer deposition ("ALD") with precursors tetrakis(dimethylamino)titanium (TDMATi, Ti[N(CH$_3$)$_2$]$_4$) and N$_2$/H$_2$ plasma and at a deposition temperature of between about 200° C. to about 350° C., or other suitable deposition processes. The second TiN layer is formed with a thickness ranging between about 1 nm to about 100 nm.

Figure 13F:
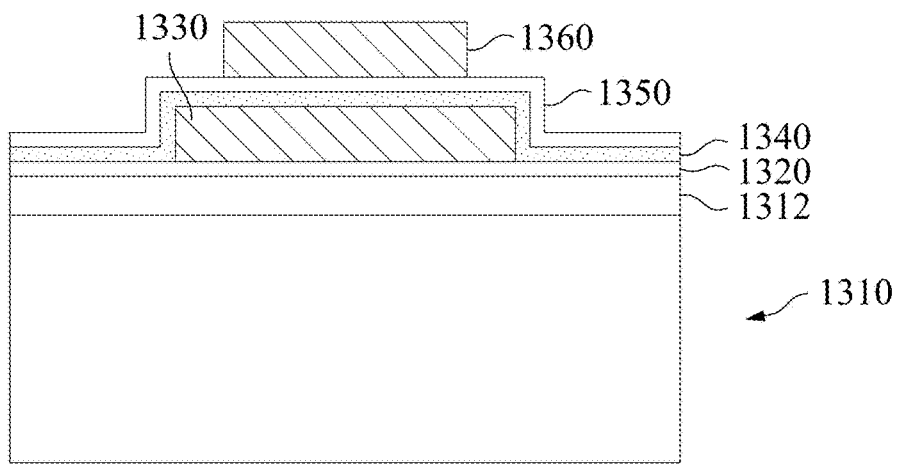

In example operation 1260, with reference also to FIG. 13F, a second metal layer 1330 of Pt is formed over the second conductive coating layer 1350. The first metal layer 1360 is formed through a physical vapor deposition process, e.g., a sputtering process, or other suitable deposition processes. The second coating layer 1350 of TiN enhances the adhesion between the second Pt layer 1360 and the underlying ferroelectric $ZrO_2$ layer 1340. The second metal layer 1360 may be globally deposited and later patterned to define the shape of a first metal layer of a MFM structure, e.g., the MFM structure 500. Alternatively or additionally, the second metal layer 1360 is formed with a desired shape through a lift-off process. Other approaches to form and shape the first metal layer 1360 is also possible and included in the disclosure.

The first metal layer 1330 or the second metal layer 1360 may be formed at a low temperature, e.g., a room temperature of about 20° C., and may be annealed to control overflow.

Figure 13G:
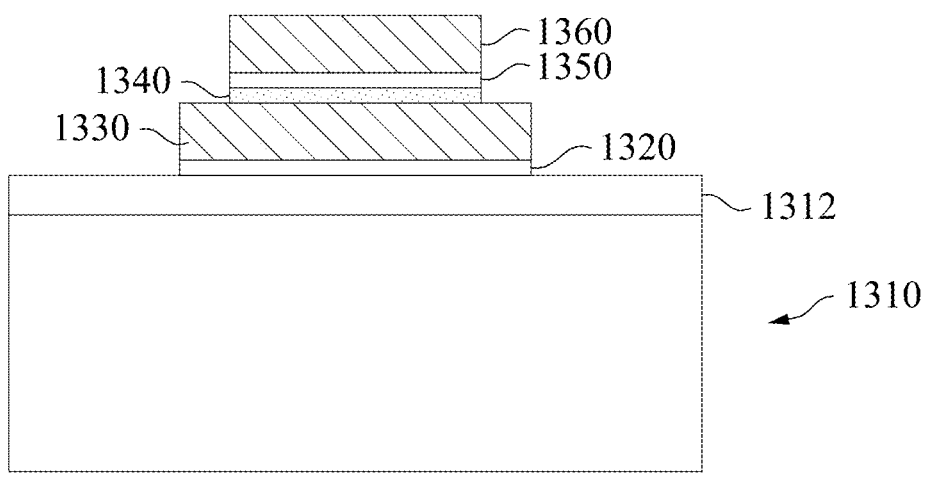

In example, operation 1270, with reference also to FIG. 13G, the first TiN layer 1320, first Pt layer 1330, the $ZrO_2$ layer 1340, the second TiN layer 1350 or the second Pt layer 1360 are patterned to form a MFM structure. The second Pt layer 1360, as patterned or formed, may be used as a mask for patterning one or more of the $ZrO_2$ layer 1340 or the second TiN layer 1350. The first Pt layer 1330, as patterned or formed, may be used as a mask for patterning the first TiN layer 1320. Other approaches to pattern the layers to form a MFM structure, e.g., the MFM structure 500, are also possible and included in the disclosure.

Figure 14:
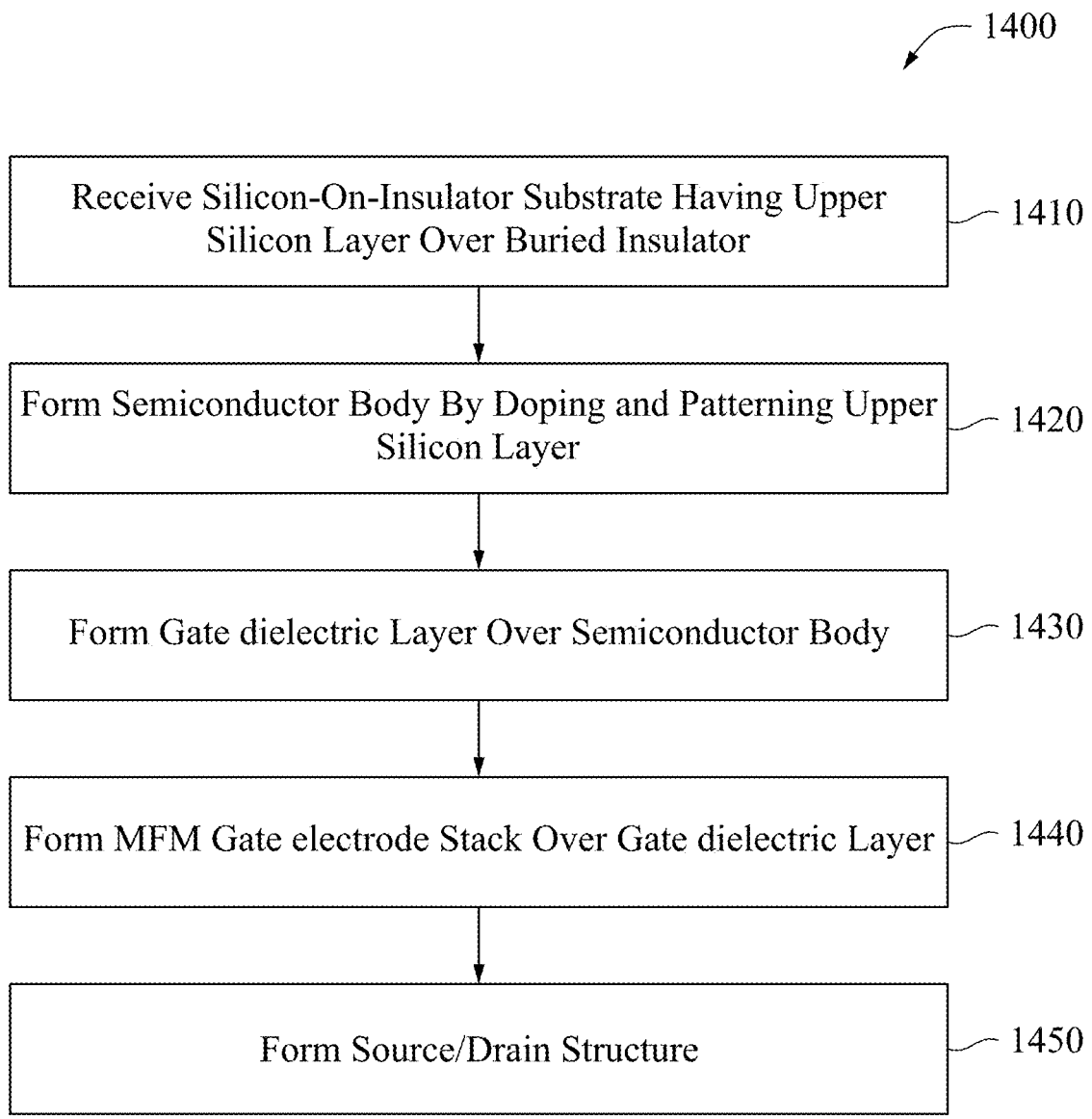
FIG. 14 is another example process.

FIG. 14 shows an example process 1400 to make a feFET structure. FIGS. 15A-15F show a cross-sectional view of a wafer 1500 in various stages of fabrication implementing the example process 1400. On each of the FIGS. 15A-15F, two cross-sectional views of the wafer 1500, e.g., x-z view and y-z view are provided. Referring to FIG. 14, in example operation 1410, with reference also to FIG. 15A, a wafer 1500 is provided. In an embodiment, the wafer 1500 includes a silicon on insulation substrate 1510 including a silicon base layer 1512, a buried insulator layer 1514 and an upper silicon layer 1516 over the buried insulator layer 1514. Other substrates, e.g., a silicon substrate, are also possible and included in the disclosure.

Figure 15A:
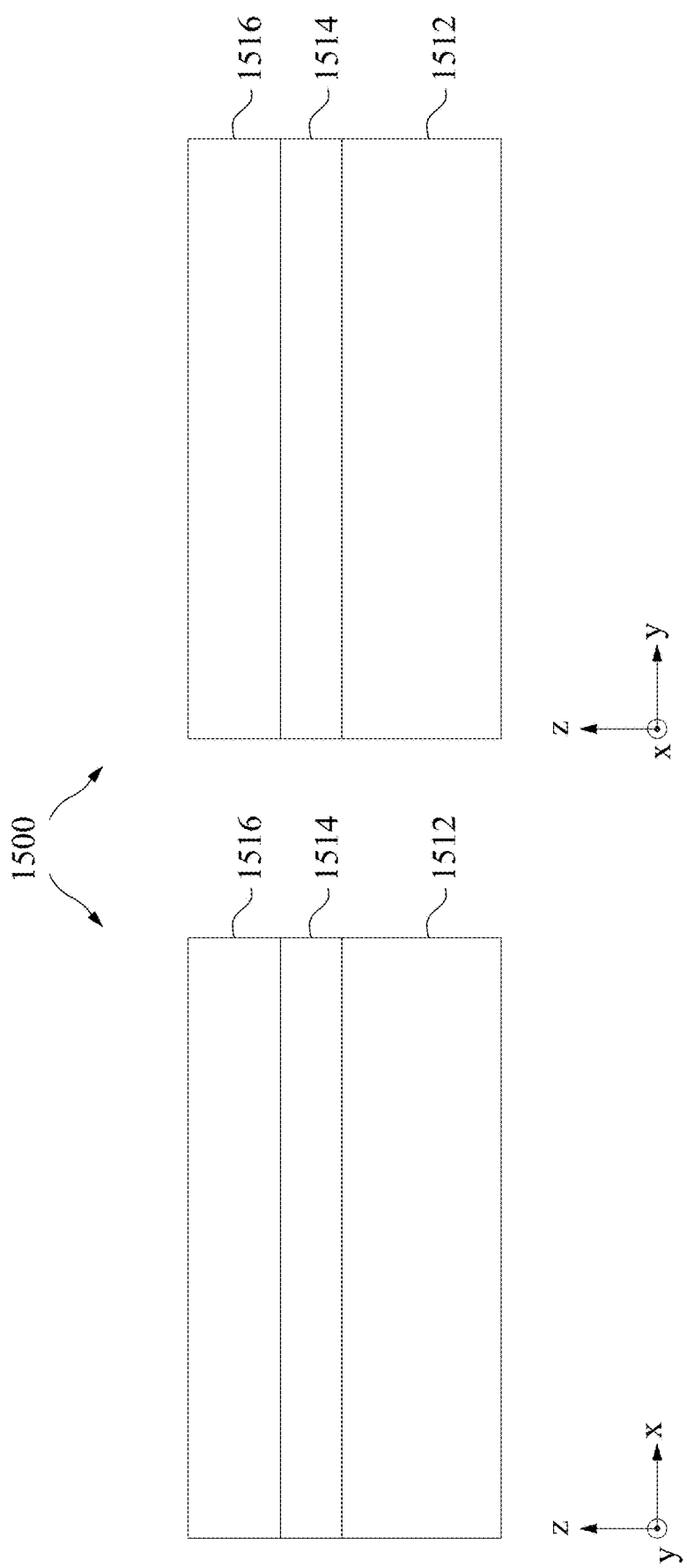
FIGS. 15A-15F are various stages of a wafer under the example process of FIG. 14.
Figure 15B:
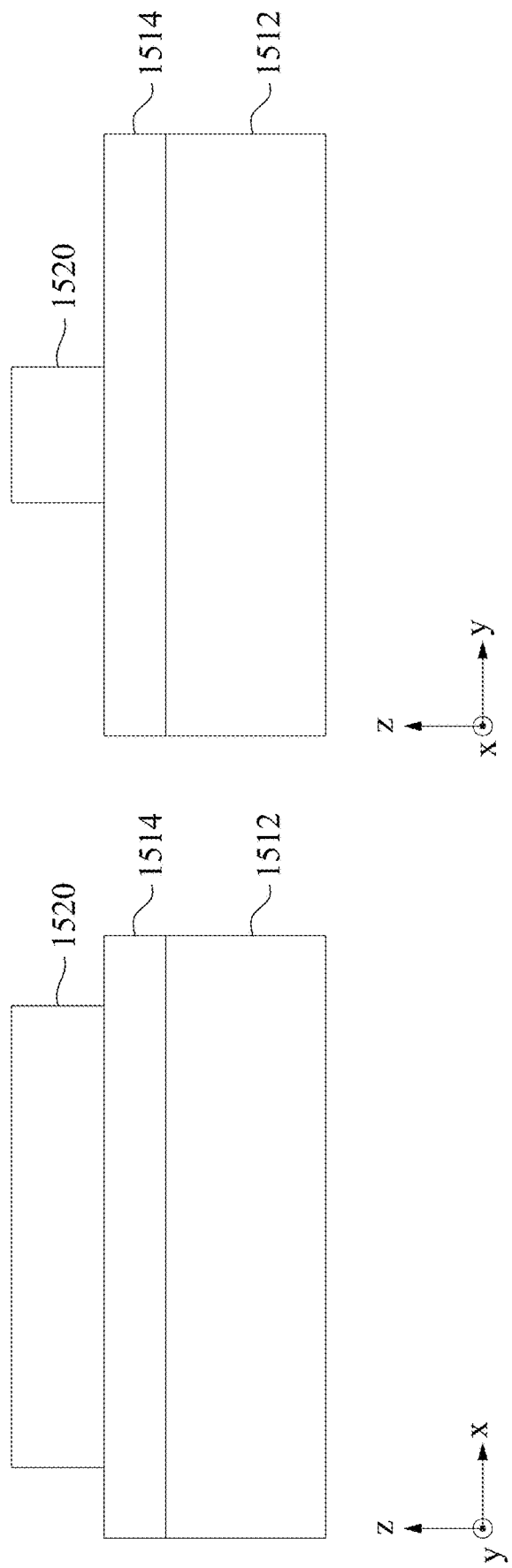

In example operation 1420, with reference also to FIG. 15B, a semiconductor body region 1520 is formed by patterning the upper silicon layer 1516. The upper silicon layer 1516 may be doped with various dopants, e.g., As or P for n-type dopants, and B or Ga for p-type dopants. For example, the upper silicon layer 1516 is heavily and substantially uniformly implanted with As ("As$^+$") suitable for an n$^k$ silicon body 1520. The doping concentration is about $5 \times 10^{18}$ ions/cm$^3$.

Figure 15C:
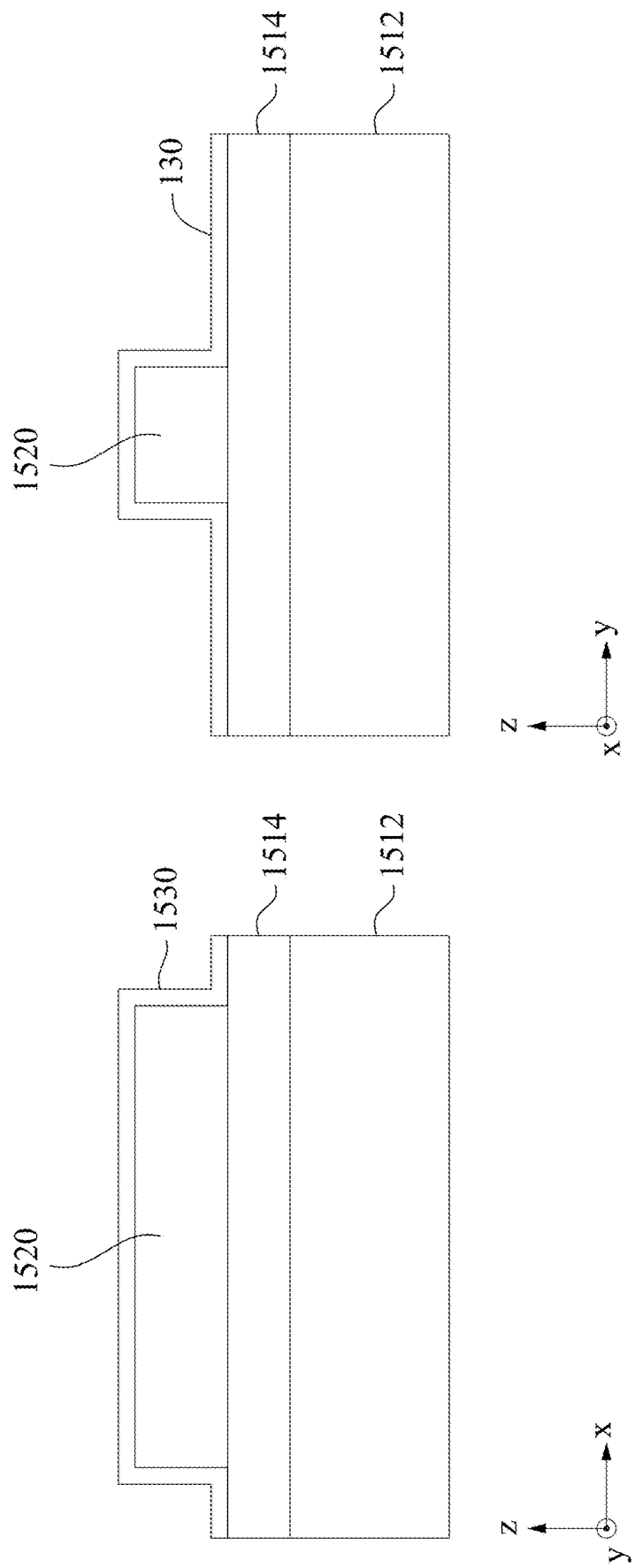

In example operation 1430, with reference also to FIG. 15C, a high-k gate dielectric layer 1530 is formed over the semiconductor body region 1520. In an embodiment, the high-k dielectric layer 1530 is HfO$_2$ or other suitable high-k dielectric materials or other dielectric materials. The HfO$_2$ layer 1530 is formed through atomic layer deposition ("ALD") with precursors tetrakis(dimethylamino)hafnium (TDMAHf, Hf[N(CH$_3$)$_2$]$_4$) and H$_2$O vapor at a deposition temperature of between about 200° C. to about 350° C., or other suitable deposition processes. In an embodiment, the HfO$_2$ layer 1530 contacts at least three surfaces, e.g., the upper surface and the sidewall surfaces, of the semiconductor body region 1520.

Figure 15D:
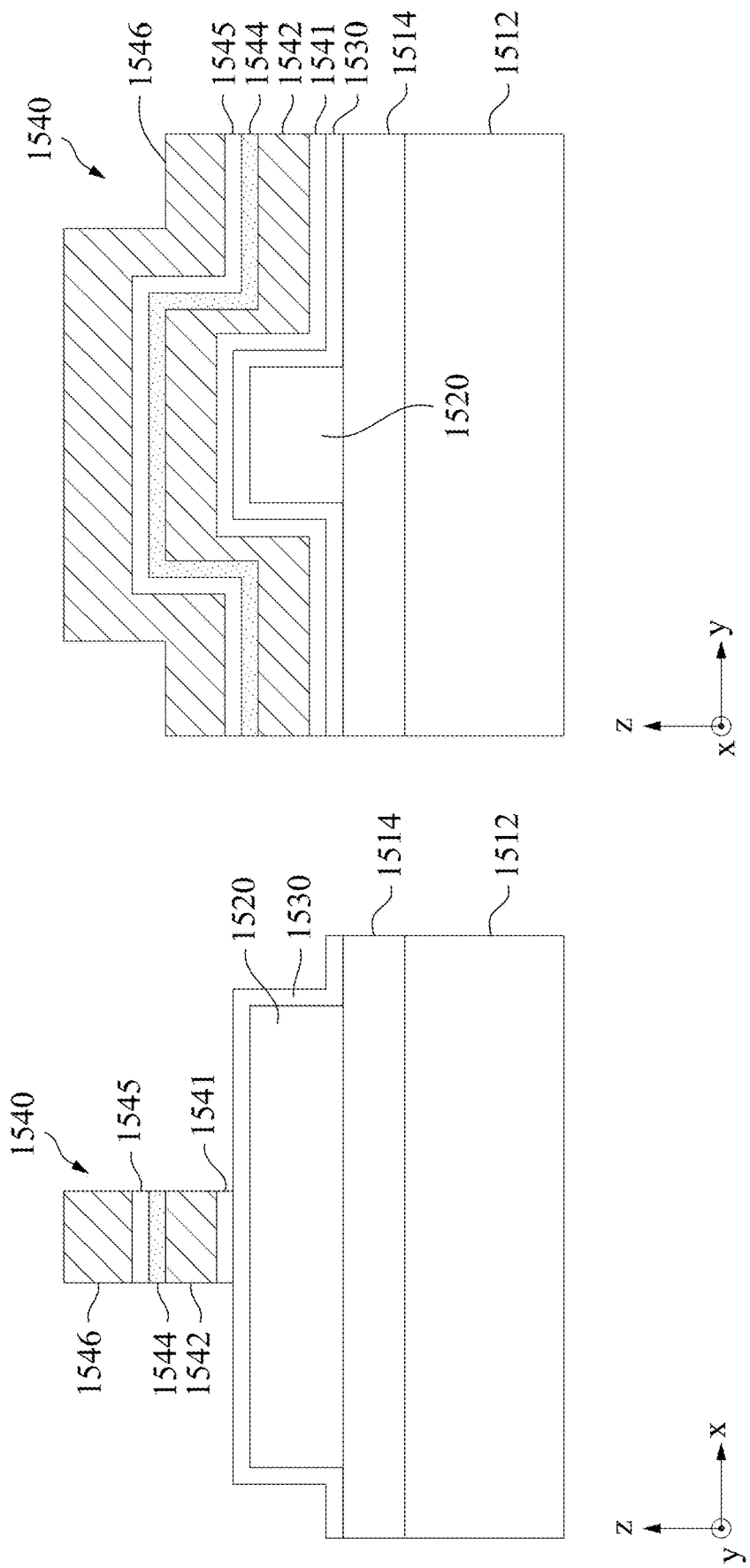

In example operation 1440, with reference also to FIG. 15D, a gate stack 1540 is formed over the high-k gate dielectric layer 1530. The gate stack 1540 includes a MFM structure having a first metal layer 1542, a ferroelectric ZrO$_2$ layer 1544 and a second metal layer 1546. Optionally, a first coating layer 1541 and a second coating layer 1545 are formed directly below the first metal layer 1542 or the second metal layer 1546, respectively, to enhance the adhesion of the first metal layer 1542 or the second metal layer 1546 to the underlying layers. The gate stack 1540 may be formed using similar processes as those described with the example process 1200, or other suitable processes. The high-k dielectric layer 1530 is patterned using the gate stack 1540 as a mask, as shown in FIG. 15E.

Figure 15E:
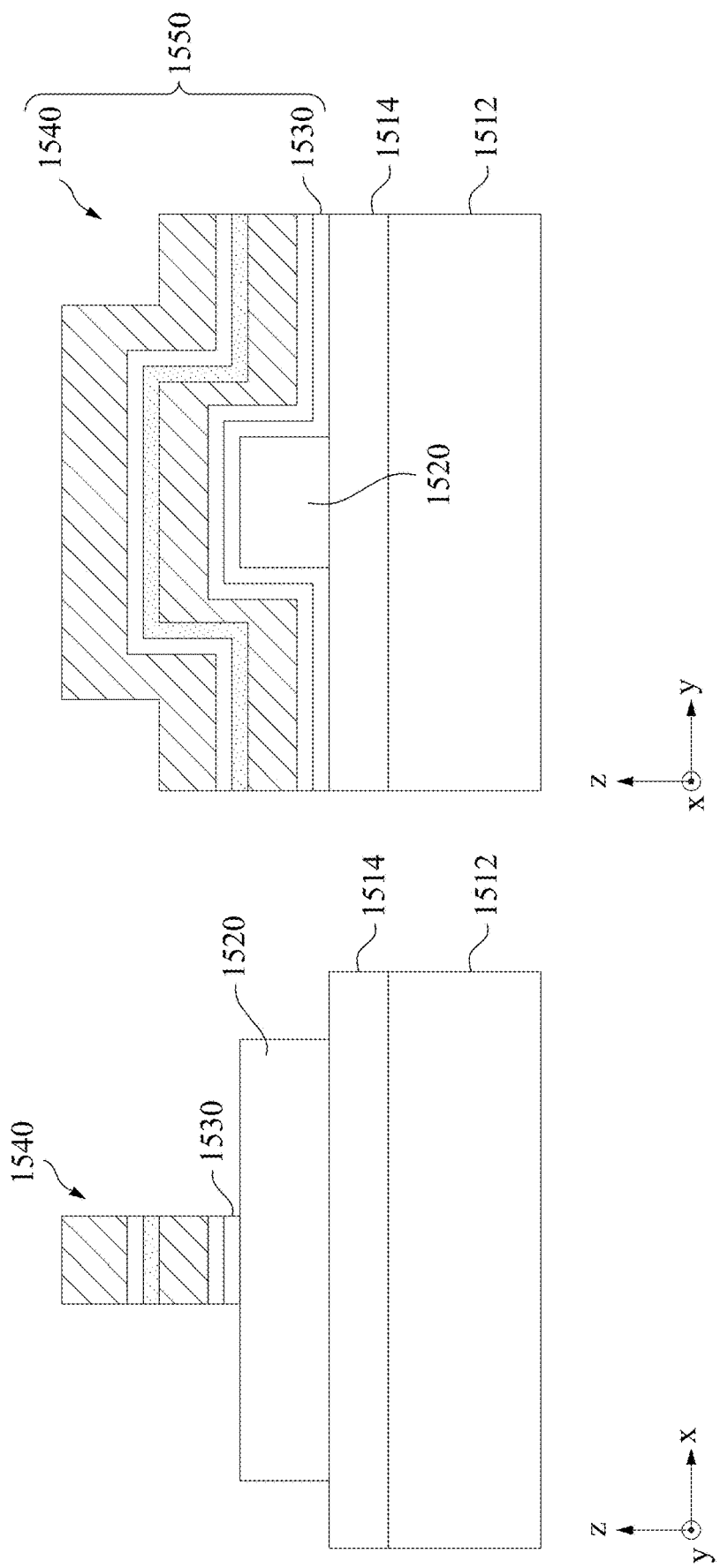

The high-k dielectric layer 1530 and the gate stack 1540 together form a gate structure 1550, as shown in FIG. 15E.

Figure 15F:
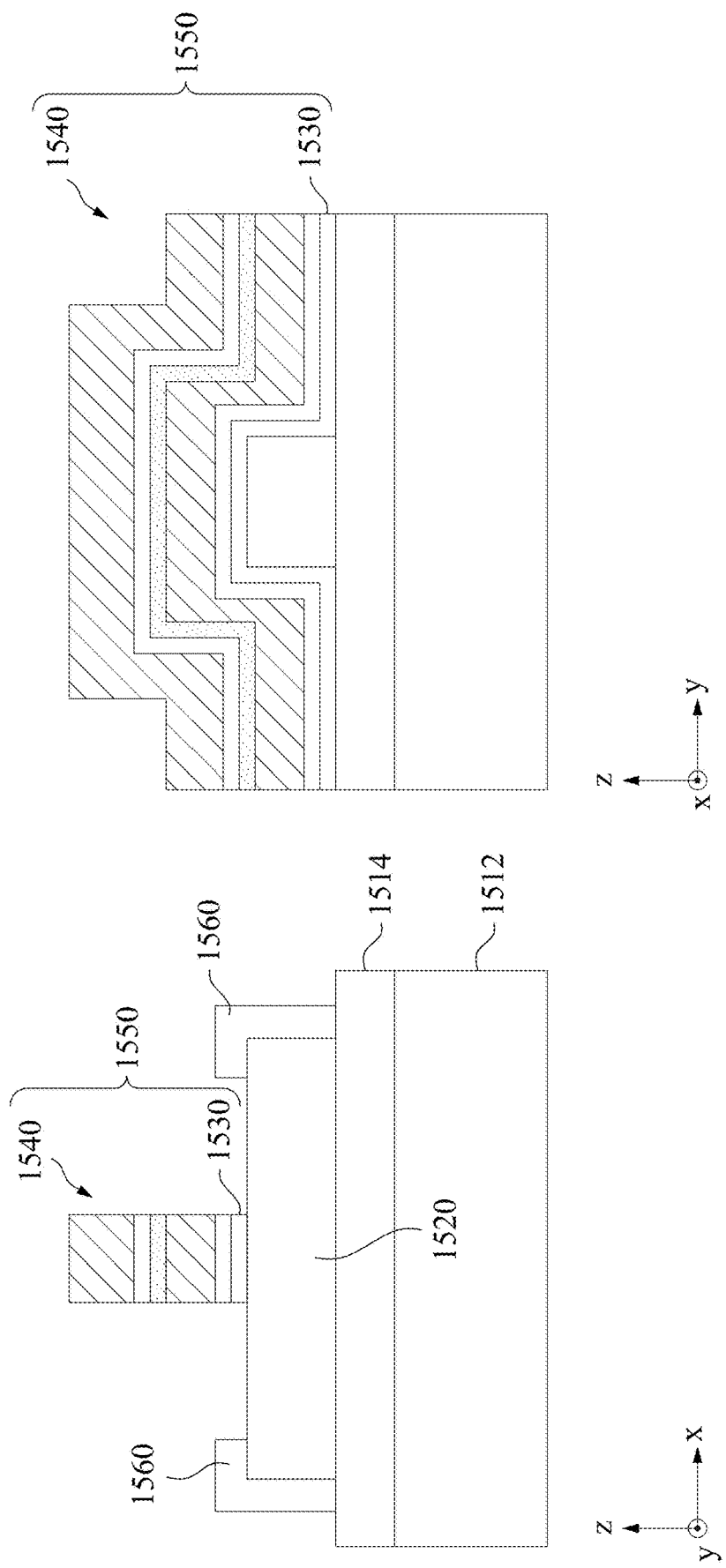

In example operation 1450, with reference also to FIG. 15F, a source/drain structure 1560 is formed adjacent to the gate structure 1550, which are separated from one another by a dielectric layer 1570. In an embodiment, the material combination of the semiconductor body 1520 and the source/drain structure 1560 are based on device/circuitry designs and configurations. For example, for a n-type device as illustrated herein, the semiconductor body region 1520 are n$^+$ silicon and the source/drain structures 1560 include one or more of SiP, SiC or SiCP. For a p-type device, the semiconductor body region 1520 is p$^+$ germanium Ge or silicon germanium SiGe and the source/drain structures 1560 includes one or more of SiGe or SiGeB. Other material combinations are also possible and included in the disclosure.

Figure 16:
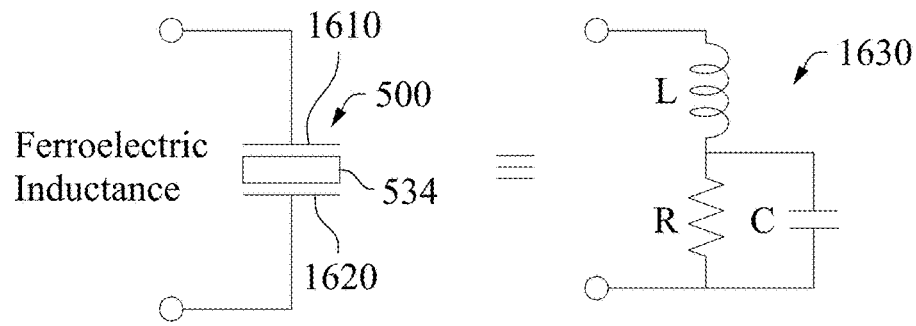
FIGS. 16-18 are example circuit applications of the MFM structure of FIG. 5.

FIG. 16 illustrates a circuit coupling example of a MFM structure, e.g., the MFM structure 500 of FIG. 5. As shown in FIG. 16, the two metal layers function as two electrodes 1610, 1620 and the ferroelectric ZrO$_2$ layer 534 is equivalent to a series LC 1630 with a resistor in parallel with the capacitance component C.

As discussed herein, the structure parameter and/or the fabrication process conditions may be controlled to tune the values of the C, L or R components of the MFM structure 500. With an increase in the thickness of the ferroelectric layer, e.g., the nanoscale ferroelectric ZrO$_2$ layer 524 (FIG. 5), the carrier conduction mechanism through the ferroelectric layer is suppressed, and so the parallel resistance R is increased. On the other hand, the capacitance C is reduced with increased thickness of the ferroelectric layer. On the other hand, the fabrication process conditions, e.g., the deposition temperatures, plasma powers, precursor doses, purge times, and working pressures of the ALD process, can be adjusted to control the amounts of defects, oxygen vacancies, dead layers, and the phase and size of crystalline grains in the ferroelectric layer, which affect the R, C, or L values of the MFM structure. For instance, a decrease in the density of defects and oxygen vacancies gives rise to a reduction in the leakage and an increase of the parallel resistance R. Further, an improvement in the crystallinity of the ZrO$_2$ layer 524 (FIG. 5) results in an increase in the dielectric constant and the capacitance C.

In addition, ferroelectric properties of ferroelectric materials are typically deteriorated as the ferroelectric layer thickness is smaller than 10 nm, leading to the degradation of the inductance effect. Note that capacitance value of the ferroelectric layer increases with decreased layer thickness. As a result, there is also a trade-off between the inductance L and the capacitance C with a decrease in the thickness of the ferroelectric layer below 10 nm.

With the proper C, L, or R values, a MFM structure as described here may be used for various circuit applications, like LC resonant circuit, band-pass circuit, band-stop circuit, low-pass filter, high-pass filter, oscillators, or negative capacitors.

Figure 17:
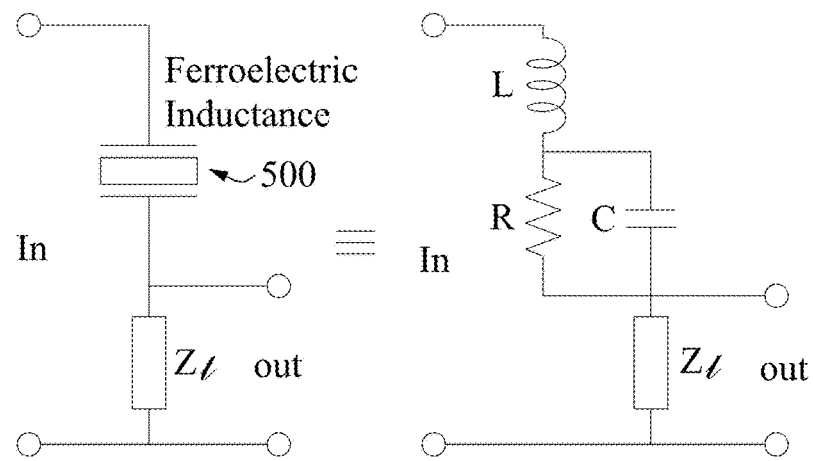

FIG. 17 shows an example circuit application of the MFM structure 500. As shown in FIG. 17, the MFM structure 500 is coupled to a load Z$_L$ and functions as a filter or oscillator to the input in.

Figure 18:
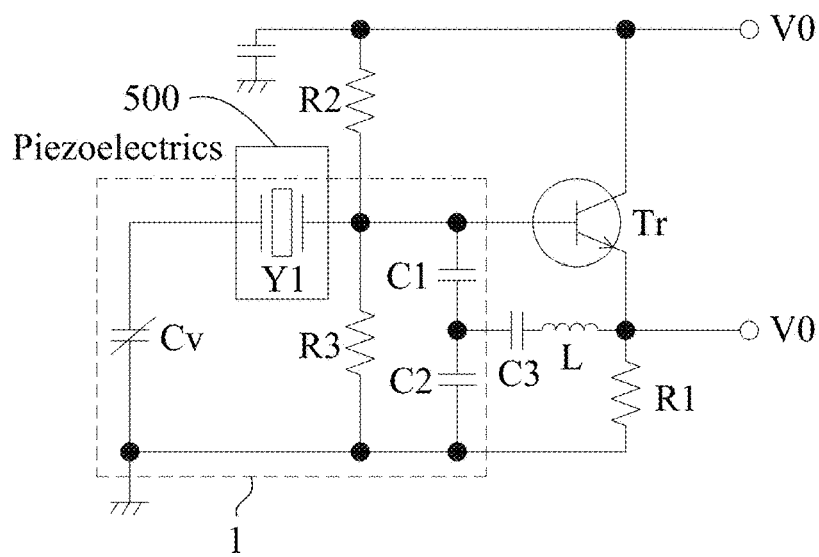

FIG. 18 shows another example circuit application of the MFM structure 500. As shown in FIG. 18, the MFM structure 500 is coupled to function as a frequency stabilizer in the circuit. One electrode of the MFM structure 500, i.e., a metal layer of the MFM structure 500, is coupled to an input signal from an example variable capacitor C$_v$, while another metal layer of the MFM structure 500, i.e., another electrode, is coupled to a load element, here a node between a resistive voltage divider circuit R$_2$ and R$_3$.

Other circuit applications of the MFM structure 500 are also possible, which is an equivalent series LC circuit with a resistor in parallel with the capacitor, and are all included in the disclosure.

Besides the specific illustrative examples, the substrate in a semiconductor structure may be a silicon substrate in a crystalline structure, e.g., the Si(111) or Si(001) crystalline structures, and/or other elementary semiconductors like germanium. Alternatively or additionally, the substrate may include a compound semiconductor such as silicon carbide, gallium arsenide, indium arsenide, sapphire, and/or indium phosphide. The substrate 110 may include an epitaxial layer and/or may be strained for performance enhancement. The substrate 110 may also include various doping configurations depending on design requirements, as is known in the art, such as p-type substrate and/or n-type substrate and various doped regions such as p-wells and/or n-wells.

The metal layer used in a gate stack or a MFM structure may include ruthenium, palladium, tungsten, cobalt, nickel, and/or conductive metal oxides and other suitable conductive materials and include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide).

In example embodiments, a high-k dielectric material may be selected from one or more of hafnium silicon oxide (HfSiO), hafnium silicon oxynitride (HfSiON), hafnium tantalum oxide (HMO), hafnium titanium oxide (HMO), hafnium zirconium oxide (HfZrO), combinations thereof, and/or other suitable materials. A high K dielectric material, in some applications, includes a dielectric constant (K) value larger than 6. Depending on design requirements, a dielectric material of a dielectric constant (K) value of 7 or higher is used.

In example embodiments, an inter-layer dielectric layer or a dielectric layer is silicon oxide or a low-k dielectric material. A low-k dielectric material includes as silicon oxynitride, silicon nitride ($Si_3N_4$), silicon monoxide (SiO), silicon oxycarbide (SiOC), vacuum, and other dielectrics or other suitable materials.

The present disclosure may be further appreciated with the description of the following embodiments:

In a circuit embodiment, a circuit includes a first circuit unit having a series LC unit and a second circuit unit coupled to the first circuit unit. The series LC unit includes a metal-ferroelectric-metal structure having first metal plate, a second metal plate and ferroelectric film sandwiched between the first metal plate and the second metal plate.

In a structure embodiment, a structure include a substrate, a semiconductor body region over the substrate, a gate structure at least partially over the semiconductor body region, and a source/drain structure adjacent to the semiconductor body region. The gate structure includes a gate dielectric layer and a metal-ferroelectric-metal gate stack over the gate dielectric layer. The metal-ferroelectric-metal gate stack has a first metal layer, a second metal layer and a ferroelectric $ZrO_2$ layer sandwiched between the first metal layer and the second metal layer.

In a method embodiment, a substrate is received. The substrate has an upper silicon layer. The upper silicon layer is doped substantially uniformly. A silicon strip structure is formed by patterning the upper silicon layer. The silicon strip has a width ranging between about 3 nm to about 60 nm or a width ranging between about 3 nm to about 25 nm. A gate structure is formed at least partially over the silicon strip. The gate structure includes a stack of metal-ferroelectric-metal layers. A source/drain structure is formed adjacent to the gate structure and contacting the silicon strip.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
a first circuit unit having a series LC unit that includes a capacitance component and an inductance component coupled in series; and
a second circuit unit coupled to the first circuit unit,
wherein the series LC unit includes a metal-ferroelectric-metal structure having a first metal plate, a second metal plate and a ferroelectric film sandwiched between the first metal plate and the second metal plate.

2. The circuit of claim 1, wherein the series LC unit also includes a resistance component coupled in parallel with the capacitance component of the series LC unit.

3. The circuit of claim 2, wherein a current response of the series LC unit is provided by an algorithm:

$$i(t) = i(t = \infty) + i_t(t) = \frac{V_S}{R} + e^{-\alpha t} A \sin(\omega_d t + \phi),$$

where i(t) is a total current across the capacitor component, $\omega_d$ is a frequency with a decay rate determined by $\alpha$, A and $\phi$ are constants, R is a resistance value of the resistance component, and Vs is a voltage source.

4. The circuit of claim 1, wherein the inductance component has an inductance density that is larger than 10 µH/cm².

5. The circuit of claim 1, wherein the ferroelectric film is $ZrO_2$.

6. The circuit of claim 1, further comprising a third circuit unit, wherein the first metal plate of the series LC unit is coupled to the second circuit unit and the second metal plate of the series LC unit is coupled to the third circuit unit.

7. The circuit of claim 1, wherein the second circuit unit is a load unit and wherein the metal-ferroelectric-metal structure is coupled in series with the load unit.

8. A circuit, comprising:
a load element coupled between an input terminal and an output terminal; and
a metal-ferroelectric-metal element coupled between the load element and the input terminal, the metal-ferroelectric-metal element including a first metal plate, a second metal plate and a ferroelectric film sandwiched between the first metal plate and the second metal plate, the first metal plate being coupled to the input terminal and the second metal plate being coupled to the load element.

9. The circuit of claim 8, wherein the metal-ferroelectric-metal element is configured to be a series LC unit that includes a capacitance component and an inductance component coupled in series.

10. The circuit of claim 9, wherein the metal-ferroelectric-metal element is configured to include a resistance component coupled in parallel with the capacitance component.

11. The circuit of claim 9, wherein the series LC unit is configured to have a current response of:

$$i(t) = i(t = \infty) + i_t(t) = \frac{V_S}{R} + e^{-\alpha t} A\sin(\omega_d t + \phi),$$

where i(t) is a total current across the capacitor component, $\omega_d$ is a frequency with a decay rate determined by $\alpha$, A and $\phi$ are constants, R is a resistance value of the resistance component, and Vs is a voltage source.

12. The circuit of claim 8, wherein the inductance component has an inductance density that is larger than 10 $\mu H/cm^2$.

13. The circuit of claim 8, wherein the ferroelectric film is $ZrO_2$.

14. The circuit of claim 9, wherein a capacitance value of the capacitance component is configured based on a thickness of the ferroelectric film.

15. The circuit of claim 9, wherein an inductance value of the inductance component is configured based on a thickness of the ferroelectric film.

16. A circuit comprising a frequency stabilizer unit and a voltage divider unit, wherein the frequency stabilizer unit includes a metal-ferroelectric-metal structure having a first metal plate, a second metal plate and a ferroelectric film sandwiched between the first metal plate and the second metal plate; and wherein the first metal plate is configured to be coupled to an input signal and the second metal plate is coupled to a node of the voltage divider unit.

17. The circuit of claim 16, wherein the metal-ferroelectric-metal structure forms a series LC unit that includes a capacitance component and an inductance component coupled in series.

18. The circuit of claim 16, wherein the series LC unit includes a resistance component coupled in parallel with the capacitance component.

19. The circuit of claim 17, wherein the inductance component has an inductance density that is larger than 10 $\mu H/cm^2$.

20. The circuit of claim 17, wherein a capacitance value of the capacitance component and an inductance value of the inductance component are configured based on a thickness of the ferroelectric film.

\* \* \* \* \*